(12) United States Patent
Hadar et al.

(10) Patent No.: US 9,813,021 B2
(45) Date of Patent: Nov. 7, 2017

(54) SYSTEM AND METHOD FOR ENHANCED WATCH DOG IN SOLAR PANEL INSTALLATIONS

(71) Applicant: Tigo Energy, Inc., Los Gatos, CA (US)

(72) Inventors: Ron Hadar, Capitola, CA (US); Shmuel Arditi, Discovery Bay, CA (US); James Bickford, Tacoma, WA (US)

(73) Assignee: TIGO ENERGY, INC., Los Gatos, CA (US)

( * ) Notice: Subject to any disclaimer, the term of this patent is extended or adjusted under 35 U.S.C. 154(b) by 0 days.

(21) Appl. No.: 15/203,713

(22) Filed: Jul. 6, 2016

(65) Prior Publication Data
US 2016/0315585 A1 Oct. 27, 2016

Related U.S. Application Data

(63) Continuation of application No. 14/473,659, filed on Aug. 29, 2014, now Pat. No. 9,397,612, which is a
(Continued)

(51) Int. Cl.
*H02S 50/00* (2014.01)
*H01L 31/02* (2006.01)
(Continued)

(52) U.S. Cl.
CPC .............. *H02S 50/00* (2013.01); *G01R 31/00* (2013.01); *H01L 31/02021* (2013.01);
(Continued)

(58) Field of Classification Search
CPC .... G05F 3/06; H02J 3/385; H04B 2203/5458; Y02E 10/50
(Continued)

(56) References Cited

U.S. PATENT DOCUMENTS 5,143,556 A 9/1992 Matlin
5,235,266 A 8/1993 Schaffrin
(Continued)

FOREIGN PATENT DOCUMENTS

AU 2005262278 7/2005
DE 4232356 3/1994
(Continued)

OTHER PUBLICATIONS

Alonso, R. et al., "A New Distributed Converter Interface for PV Panels," 20th European Photovoltaic Solar Energy Conference, Barcelona, Spain, pp. 2288-2291, Jun. 6-10, 2005.
(Continued)

*Primary Examiner* — Robert Deberadinis
(74) *Attorney, Agent, or Firm* — Greenberg Traurig, LLP

(57) ABSTRACT

A system and method for automated shutdown, disconnect, or power reduction of solar panels. A system of solar panels includes one or more master management units (MMUs) and one or more local management units (LMUs). The MMUs are in communication with the LMUs with the MMUs and LMUs "handshaking" when the system is in operation. The MMUs are connected to one or more controllers which in turn are connected to emergency detection sensors. Upon a sensor detection of an emergency, the associated MMU is notified which in turn instructs associated LMUs to take appropriate action. In the event that communication with the MMUs has been cut off, the LMUs take the initiative to shut down, disconnect, or reduce the output of associated string(s) of solar panels.

17 Claims, 20 Drawing Sheets

Related U.S. Application Data continuation of application No. 13/092,783, filed on Apr. 22, 2011, now Pat. No. 8,823,218, which is a continuation-in-part of application No. 12/628,977, filed on Dec. 1, 2009, now Pat. No. 8,933,321, said application No. 13/092,783 is a continuation-in-part of application No. 12/411,317, filed on Mar. 25, 2009, now Pat. No. 7,602,080, said application No. 13/092,783 is a continuation-in-part of application No. 12/254,780, filed on Oct. 20, 2008, now Pat. No. 7,884,278.

(60) Provisional application No. 61/343,155, filed on Apr. 22, 2010, provisional application No. 61/276,753, filed on Sep. 16, 2009, provisional application No. 61/275,977, filed on Sep. 3, 2009, provisional application No. 61/200,601, filed on Dec. 2, 2008, provisional application No. 61/001,587, filed on Nov. 2, 2007.

(51) Int. Cl.
   G01R 31/00   (2006.01)
   H02J 3/38    (2006.01)

(52) U.S. Cl.
   CPC ...... *H02J 3/385* (2013.01); *H04B 2203/5458* (2013.01); *Y02E 10/50* (2013.01)

(58) Field of Classification Search
   USPC .......................................................... 307/151
   See application file for complete search history.

(56) References Cited

U.S. PATENT DOCUMENTS

| | | | |
|---|---|---|---|
| 5,268,832 A | 12/1993 | Kandatsu | |
| 5,280,133 A | 1/1994 | Nath | |
| 5,472,614 A | 12/1995 | Rossi | |
| 5,604,430 A | 2/1997 | Decker et al. | |
| 5,923,158 A | 7/1999 | Kurokami et al. | |
| 6,031,736 A | 2/2000 | Takehara et al. | |
| 6,093,885 A | 7/2000 | Takehara et al. | |
| 6,101,073 A | 8/2000 | Takehara | |
| 6,275,016 B1 | 8/2001 | Ivanov | |
| 6,350,944 B1 | 2/2002 | Sherif et al. | |
| 6,396,239 B1 | 5/2002 | Benn et al. | |
| 6,448,489 B2 | 9/2002 | Kimura et al. | |
| 6,515,215 B1 | 2/2003 | Mimura | |
| 6,545,211 B1 | 4/2003 | Mimura | |
| 6,593,520 B2 | 7/2003 | Kondo et al. | |
| 6,650,031 B1 | 11/2003 | Goldack | |
| 6,653,549 B2 | 11/2003 | Matsushita et al. | |
| 6,763,226 B1 | 7/2004 | McZeal, Jr. | |
| 6,837,739 B2 | 1/2005 | Gorringe et al. | |
| 6,844,739 B2 | 1/2005 | Kasai et al. | |
| 6,894,911 B2 | 5/2005 | Telefus et al. | |
| 6,897,370 B2 | 5/2005 | Kondo et al. | |
| 6,984,970 B2 | 1/2006 | Capel | |
| 7,061,214 B2 | 6/2006 | Mayega et al. | |
| 7,150,938 B2 | 12/2006 | Munshi et al. | |
| 7,248,946 B2 | 7/2007 | Bashaw et al. | |
| 7,256,566 B2 | 8/2007 | Bhavaraju et al. | |
| 7,276,886 B2 | 10/2007 | Kinder et al. | |
| 7,516,106 B2 | 4/2009 | Ehlers et al. | |
| 7,518,346 B2 | 4/2009 | Prexl et al. | |
| 7,595,616 B2 | 9/2009 | Prexl et al. | |
| 7,602,080 B1 | 10/2009 | Hadar et al. | |
| 7,605,498 B2 | 10/2009 | Ledenev et al. | |
| 7,719,140 B2 | 5/2010 | Ledenev et al. | |
| 7,807,919 B2 | 10/2010 | Powell et al. | |
| 7,884,278 B2 | 2/2011 | Powell et al. | |
| 8,212,139 B2 | 7/2012 | Meyer | |
| 8,563,847 B2 | 10/2013 | Meyer et al. | |
| 8,823,218 B2 * | 9/2014 | Hadar | H01L 31/02021 307/151 |
| 8,828,778 B2 | 9/2014 | Meyer | |
| 8,854,193 B2 | 10/2014 | Makhota et al. | |
| 8,933,320 B2 | 1/2015 | Meyer | |
| 8,933,321 B2 | 1/2015 | Hadar et al. | |
| 9,377,765 B2 | 6/2016 | Makhota et al. | |
| 9,397,612 B2 | 7/2016 | Hadar et al. | |
| 9,543,890 B2 | 1/2017 | Meyer et al. | |
| 9,768,725 B2 | 9/2017 | Meyer | |
| 2001/0023703 A1 | 9/2001 | Kondo et al. | |
| 2004/0056768 A1 | 3/2004 | Matsushita et al. | |
| 2005/0057214 A1 | 3/2005 | Matan | |
| 2005/0057215 A1 | 3/2005 | Matan | |
| 2006/0001406 A1 | 1/2006 | Matan | |
| 2006/0174939 A1 | 8/2006 | Matan | |
| 2006/0185727 A1 | 8/2006 | Matan | |
| 2006/0231132 A1 | 10/2006 | Neussner | |
| 2007/0019613 A1 | 1/2007 | Frezzolini | |
| 2007/0229237 A1 | 10/2007 | Kates | |
| 2007/0273351 A1 | 11/2007 | Matan | |
| 2008/0121272 A1 | 5/2008 | Besser et al. | |
| 2008/0122449 A1 | 5/2008 | Besser et al. | |
| 2008/0122518 A1 | 5/2008 | Besser et al. | |
| 2008/0142071 A1 | 6/2008 | Dorn et al. | |
| 2008/0147335 A1 | 6/2008 | Adest et al. | |
| 2008/0164766 A1 | 7/2008 | Adest et al. | |
| 2008/0179949 A1 | 7/2008 | Besser et al. | |
| 2008/0191560 A1 | 8/2008 | Besser et al. | |
| 2008/0191675 A1 | 8/2008 | Besser et al. | |
| 2008/0236648 A1 | 10/2008 | Klein et al. | |
| 2008/0303503 A1 | 12/2008 | Wolfs | |
| 2009/0066357 A1 | 3/2009 | Fornage | |
| 2009/0114263 A1 | 5/2009 | Powell et al. | |
| 2009/0133736 A1 | 5/2009 | Powell et al. | |
| 2009/0179662 A1 | 7/2009 | Moulton et al. | |
| 2009/0182532 A1 | 7/2009 | Stoeber et al. | |
| 2009/0183760 A1 | 7/2009 | Meyer | |
| 2009/0207543 A1 | 8/2009 | Boniface et al. | |
| 2009/0242011 A1 | 10/2009 | Proisy et al. | |
| 2010/0057267 A1 | 3/2010 | Liu et al. | |
| 2010/0071274 A1 | 3/2010 | Brescia | |
| 2010/0085670 A1 | 4/2010 | Palaniswami et al. | |
| 2010/0131108 A1 | 5/2010 | Meyer | |
| 2010/0132758 A1 | 6/2010 | Gilmore | |
| 2010/0139734 A1 | 6/2010 | Hadar et al. | |
| 2010/0282293 A1 | 11/2010 | Meyer et al. | |
| 2010/0300508 A1 | 12/2010 | Maier et al. | |
| 2010/0321148 A1 | 12/2010 | Gevorkian | |
| 2010/0326809 A1 | 12/2010 | Lang et al. | |
| 2011/0061713 A1 | 3/2011 | Powell et al. | |
| 2011/0172842 A1 | 7/2011 | Makhota et al. | |
| 2011/0218687 A1 | 9/2011 | Hadar et al. | |
| 2012/0234374 A1 | 9/2012 | Meyer | |
| 2014/0035373 A1 | 2/2014 | Meyer et al. | |
| 2015/0028692 A1 | 1/2015 | Makhota et al. | |
| 2015/0047689 A1 | 2/2015 | Meyer | |
| 2015/0053250 A1 | 2/2015 | Hadar et al. | |
| 2015/0101651 A1 | 4/2015 | Hadar et al. | |
| 2016/0301214 A1 | 10/2016 | Makhota et al. | |
| 2017/0085094 A1 | 3/2017 | Meyer et al. | |

FOREIGN PATENT DOCUMENTS

| | | |
|---|---|---|
| DE | 19961705 | 7/2001 |
| DE | 102005012213 | 1/2009 |
| DE | 102007050031 | 4/2009 |
| DE | 102005018173 | 5/2009 |
| EP | 1388774 | 2/2004 |
| EP | 2495766 | 9/2012 |
| ES | 2249147 | 3/2006 |
| JP | 4219982 | 8/1992 |
| JP | 6125104 | 5/1994 |
| JP | 8097460 | 4/1996 |
| JP | 8116628 | 5/1996 |
| JP | 8316517 | 11/1996 |
| JP | 9148611 | 6/1997 |
| JP | 11103538 | 4/1999 |
| JP | 2000358330 | 12/2000 |

(56) References Cited

FOREIGN PATENT DOCUMENTS

| JP | 2003134661 | 5/2003 |
|---|---|---|
| KR | 200402282 | 11/2005 |
| KR | 100725755 | 6/2007 |
| KR | 100912892 | 8/2009 |
| WO | 03012569 | 2/2003 |
| WO | 2007048421 | 5/2007 |
| WO | 2008077473 | 7/2008 |
| WO | 2009006879 | 1/2009 |
| WO | 2010037393 | 4/2010 |

OTHER PUBLICATIONS

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.
Advanced Energy Group, "The Basics of Solar Power Systems," located at http://web.archive.org/web/20010331044156/http://www.solar4power.com/solar-power-basics.html, Mar. 31, 2001.
Basso, Tim, "IEEE Standard for Interconnecting Distributed Resources With the Electric Power System," IEEE PES Meeting, Jun. 9, 2004.
Boostbuck.com, "The Four Boostbuck Topologies," located at http://www.boostbuck.com/TheFourTopologies.html, 2003.
Definition of "removable" from Webster's Third New International Dictionary, Unabridged, 1993.
Definition of "remove" from Webster's Third New International Dictionary, Unabridged, 1993.
Enslin, Johan H.R., et al., "Integrated Photovoltaic Maximum Power Point Tracking Converter," IEEE Transactions on Industrial Electronics, vol. 44, No. 6, pp. 769-773, Dec. 1997.
European Patent Application No. 08845104.2, Extended Search Report, Jul. 31, 2014.
European Patent Application No. 11772811.3, Extended Search Report, Dec. 15, 2014.
Gautam, Nalin K. et al., "An Efficient Algorithm to Simulate the Electrical Performance of Solar Photovoltaic Arrays," Energy, vol. 27, No. 4, pp. 347-361, 2002.
Hewes, J. "Relays," located at http://web.archive.org/web/20030816010159/www.kpsec.freeuk.com/components/relay.htm, Aug. 16, 2003.
International Patent Application No. PCT/US2008/081827, International Search Report and Written Opinion, Jun. 24, 2009.
International Patent Application No. PCT/US2010/046274, International Search Report and Written Opinion, Apr. 22, 2011.
International Patent Application No. PCT/US2011/033658, International Search Report and Written Opinion, Jan. 13, 2012.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.
Quaschning, V. et al., "Cost Effectiveness of Shadow Tolerant Photovoltaic Systems," Eurosun 96, pp. 819-824, Sep. 16, 1996.
Roman, Eduardo, et al., "Intelligent PV Module for Grid-Connected PV Systems," IEEE Transactions on Industrial Electronics, vol. 53, No. 4, pp. 1066-1073, Aug. 2006.
Uriarte, S. et al., "Energy Integrated Management System for PV Applications," 20th European Photovoltaic Solar Energy Conference, Jun. 6, 2005.
Walker, G. R. et al., "Cascaded DC-DC Converter Connection of Photovoltaic Modules," 33rd IEEE Power Electronics Specialists Conference (PESC'02), vol. 1, pp. 24-29, 2002.
Walker, Geoffrey R. et al., "Cascaded DC-DC Converter Connection of Photovoltaic Modules," IEEE Transactions on Power Electronics, vol. 19, No. 4, pp. 1130-1139, Jul. 2004.
Wiles, John, "Photovoltaic Power Systems and the National Electrical Code: Suggested Practices," Sandia National Laboratories, document No. SAND2001-0674, Mar. 2001.

* cited by examiner

SYSTEM AND METHOD FOR ENHANCED WATCH DOG IN SOLAR PANEL INSTALLATIONS

RELATED APPLICATIONS

The present application is a continuation application of U.S. patent application Ser. No. 14/473,659, filed Aug. 29, 2014, published as U.S. Pat. App. Pub. No. 2015/0053250 on Feb. 26, 2015, and entitled "System and Method for Enhanced Watch Dog in Solar Panel Installations", which is a continuation application of U.S. patent application Ser. No. 13/092,783, filed Apr. 22, 2011, issued as U.S. Pat. No. 8,823,218 on Sep. 2, 2014, and entitled "System and Method for Enhanced Watch Dog in Solar Panel Installations", which claims the benefit of the filing date of Prov. U.S. patent application Ser. No. 61/343,155, filed Apr. 22, 2010, entitled "System and Method for Enhanced Watch Dog in Solar Panel Installations," where U.S. patent application Ser. No. 13/092,783 is a continuation-in-part application of U.S. patent application Ser. No. 12/254,780, filed Oct. 20, 2008, entitled "Apparatuses and Methods to Reduce Safety Risks Associated with Photovoltaic Systems," issued as U.S. Pat. No. 7,884,278 on Feb. 8, 2011, which claims the benefit of filing date of Prov. U.S. patent application Ser. No. 61/001,587, filed Nov. 2, 2007, and entitled "Photovoltaic Safety Switch," where U.S. patent application Ser. No. 13/092,783 is also a continuation-in-part application of U.S. patent application Ser. No. 12/411,317, filed Mar. 25, 2009, entitled "Systems and Methods to Balance Solar Panels in a Multi-Panel System," issued as U.S. Pat. No. 7,602,080 on Oct. 13, 2009, which claims the benefit of filing date of Prov. U.S. patent application Ser. No. 61/200,601, filed Dec. 2, 2008, and entitled "Enhanced System and Method for Balancing Solar Panels in a Multi-Panel System," where U.S. patent application Ser. No. 13/092,783 is also a continuation-in-part application of U.S. patent application Ser. No. 12/628,977, filed Dec. 1, 2009, entitled "Systems and Methods for an Enhanced Watchdog in Solar Module Installations," issued as U.S. Pat. No. 8,933,321 on Jan. 13, 2015, which claims the benefit of filing dates of Prov. U.S. patent application Ser. No. 61/275,977, filed Sep. 3, 2009, and entitled "System and Method for Enhanced Watch Dog in Solar Panel Installations," and Prov. U.S. patent application Ser. No. 61/276,753, filed Sep. 16, 2009, entitled "System and Method for Enhanced Watch Dog in Solar Panel Installations," the entire contents of which applications are hereby incorporated by reference as if fully set forth herein.

COPYRIGHT NOTICE AND PERMISSION

A portion of the disclosure of this patent document contains material which is subject to copyright protection. The copyright owner has no objection to the facsimile reproduction by anyone of the patent document or the patent disclosure, as it appears in the patent and trademark office patent file or records, but otherwise reserves all copyright rights whatsoever.

FIELD OF INVENTION

The present invention relates to the field of electrical safeguards for photovoltaic systems.

BACKGROUND

When a photovoltaic panel or laminate is exposed to direct or diffuse light, a lethal voltage potential may be present. In the United States the possible voltage could be as high as 600 volts, while in Europe and the rest of the world this voltage could approach a kilovolt.

Because of this potential danger from electrical shock, solar panel manufacturers and code and standards development organizations have made some recommendations to minimize or eliminate this danger.

One suggestion has been to cover the photovoltaic panel with an opaque material such as a tarpaulin. However, this approach proposes its own safety risk from having the wind catch the tarpaulin and pull installation personnel off the roof as they try to control the unstable sheet material against the wind.

Another recommendation is to install and/or service the photovoltaic panels at night when there is minimal risk of the panels being energized. This approach presents the potential safety risks associated from working in a poorly lighted environment.

In addition to the potential personnel safety issues there are also significant risks to equipment and hardware. Connecting or disconnecting energized plugs can cause arcing and damage to these connectors, junction boxes, and other electrical components.

Solar system installers take a large guard band (or safety margin) to make sure the voltages don't cross the 600V or 1000V limits in the United States and the European Union, respectively. That limitation inhibits them from installing more solar panel modules, often referred to as "modules" or "panels," in series to reduce the cost of combiner boxes or string inverters. When solar modules are connected in series or in mesh configurations, there can be a problem in which weaker modules not only produce less energy but also affect other modules' capabilities to deliver energy in the same string or wiring section.

In solar panel installations it is often desirable to have additional safety for the operating environment and for personnel involved with maintenance, etc. Of particular concern are certain portions of the wiring. If certain wires are disconnected, through theft, vandalism, accident, natural forces, or any other cause, voltages may rise to an unacceptable, even dangerous, level.

In addition to locally generated problems that can affect the safety of the system and or people working at or near the system, other, more regionally created problems may cause safety issues, including, for example, floods, forest fires or neighborhood fires, earthquakes, landslides, etc.

BRIEF SUMMARY OF THE INVENTION

Disclosed herein are embodiments of a system and method to monitor one or more sensors for anomalies in the operation of a photovoltaic system. In the event of an anomaly, the system may shut down or modify the operation of all or part of the system.

Also disclosed herein are embodiments of a watchdog system to monitor communication signals between a central controller and a local controller. If one or more communication signals are not properly received, the watchdog system polls the central controller to determine if the breakdown in communication is transient. In addition, the watchdog circuit may monitor the electrical signals to determine if there is an irregularity. The watchdog system may notify the local controller to shut down or modify the operation of any or all solar modules if it determines that the breakdown in communication is either not transient or if the irregularity in the electrical signals is persistent.

These and other objects and advantages of the present invention will become clear to those skilled in the art in view of the description of the best presently known mode of carrying out the invention and the industrial applicability of the preferred embodiment as described herein.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

The use of headings herein are merely provided for ease of reference, and shall not be interpreted in any way to limit this disclosure or the following claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Reducing Safety Risks

One embodiment of the disclosure provides a method and system to reduce the safety risks during the shipment, installation and/or maintenance of photovoltaic systems, without introducing the risks associated with other approaches, such as covering them with an opaque material or working on them at night.

In one embodiment, safety protection is provided via the inclusion of a normally closed switch integral to the panel junction box or integral to the panel module when alternating current (AC) or direct current (DC) modules are used.

Figure 1:
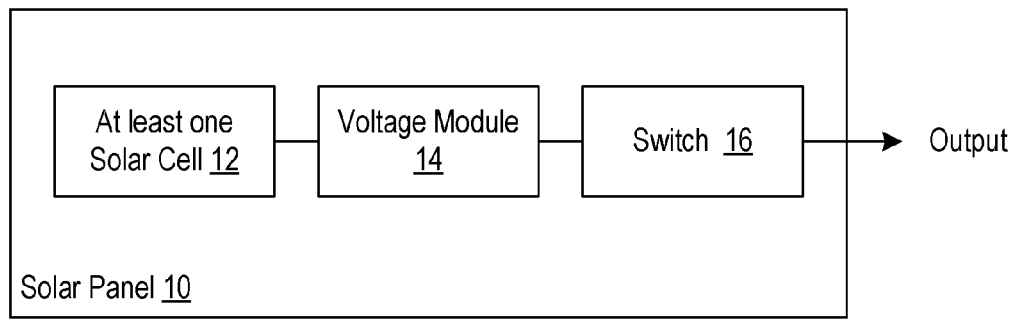
FIG. 1 illustrates a solar panel having a safety switch according to one embodiment.

FIG. 1 illustrates a solar panel having a safety switch according to one embodiment. In FIG. 1, a solar panel 10 (e.g., a photovoltaic panel) includes at least one solar cell 12 (e.g., a photovoltaic cell) to generate power when exposed to direct or diffuse light, in some cases a voltage module 14 to adjust or regulate the output voltage (or in some other cases a current module to regulate current), and a switch 16 to selectively isolate the solar cell 12 from the output connectors of the solar panel. In yet other cases, the switch may be incorporated into regulator modules, such as voltage module 14.

In one embodiment, the switch 16 is a normally closed switch. During the shipment, installation and/or maintenance, the switch 16 is placed in an open state to isolate the solar cell 12 from the output. After the installation or maintenance, the switch 16 is placed into a closed state to allow the solar cell 12 to energize the output connectors of the solar panel and to supply power through the output connectors of the solar panel.

The switch 16 and the voltage module can be integrated into the junction box of the solar panel. In some embodiment, the switch 16 is integrated with the voltage module 14 as a panel module.

FIGS. 2 through 5 illustrate a spring loaded safety switch for a photovoltaic panel according to one embodiment. In FIGS. 2 through 5, the switch includes two contactors 102 and 103 made of a conductive metal or plated hybrid. The contactors 102 and 103 are normally made of a spring alloy metal or have an integral spring plunger design (not shown). The contactors 102 and 103 are positioned or fixed in such a way that the two contacts 102 and 103 are spring loaded toward each other to maintain electrical continuity between the two contactors 102 and 103. Thus, the switch is normally closed (NC) and not in a safe mode for installation or maintenance.

Figure 2:
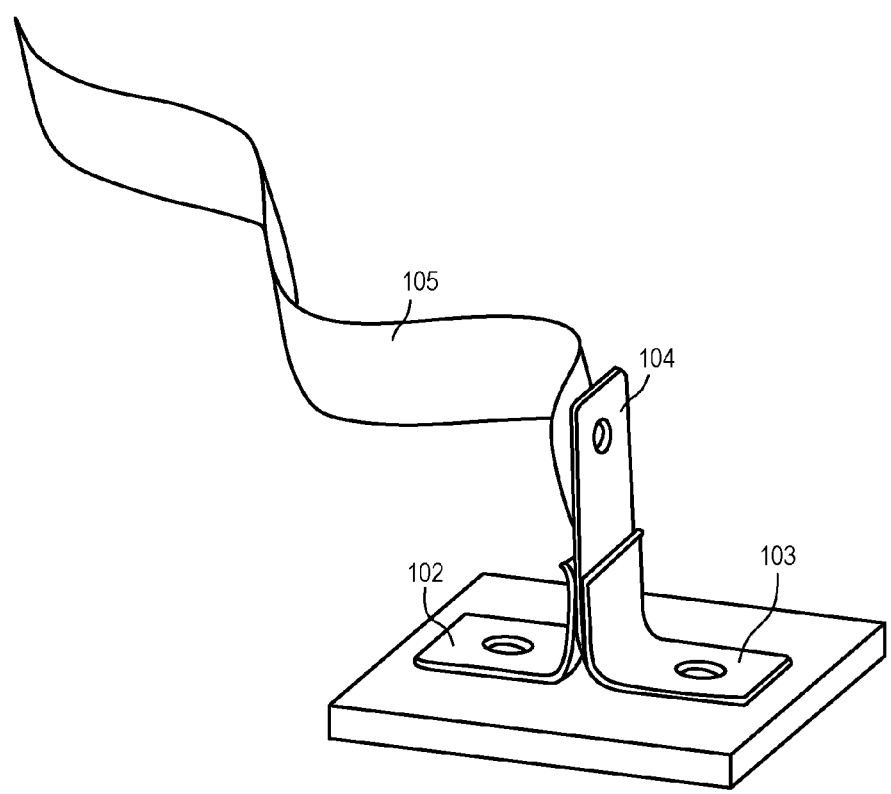
FIGS. 2-5 illustrate a spring loaded safety switch for a photovoltaic panel according to one embodiment.

In FIG. 2, a safe mode for installation or maintenance is achieved when the blade 104 is inserted between the two contactors 102 and 103. The blade 104 is manufactured from a dielectric material and when inserted between the two contactors 102 and 103 there is no electrical continuity between the contactors 102 and 103.

As illustrated in FIG. 2, the blade 104 may also have a flag 105 attached. The flag 105 could be red or some other highly visible color, to provide a visual indicator of the state of the panel.

In one embodiment, the panels and/or panel with integral modules would come shipped from the factory with the blade 104 and the flag 105, where the blade 104 is inserted between the two contactors 102 and 103. The panels would be installed and integrated with the blade 104 present and flag 105 visible. The installer would mount, secure, and plug in all of the connections in the system, including the grounding.

Figure 3:
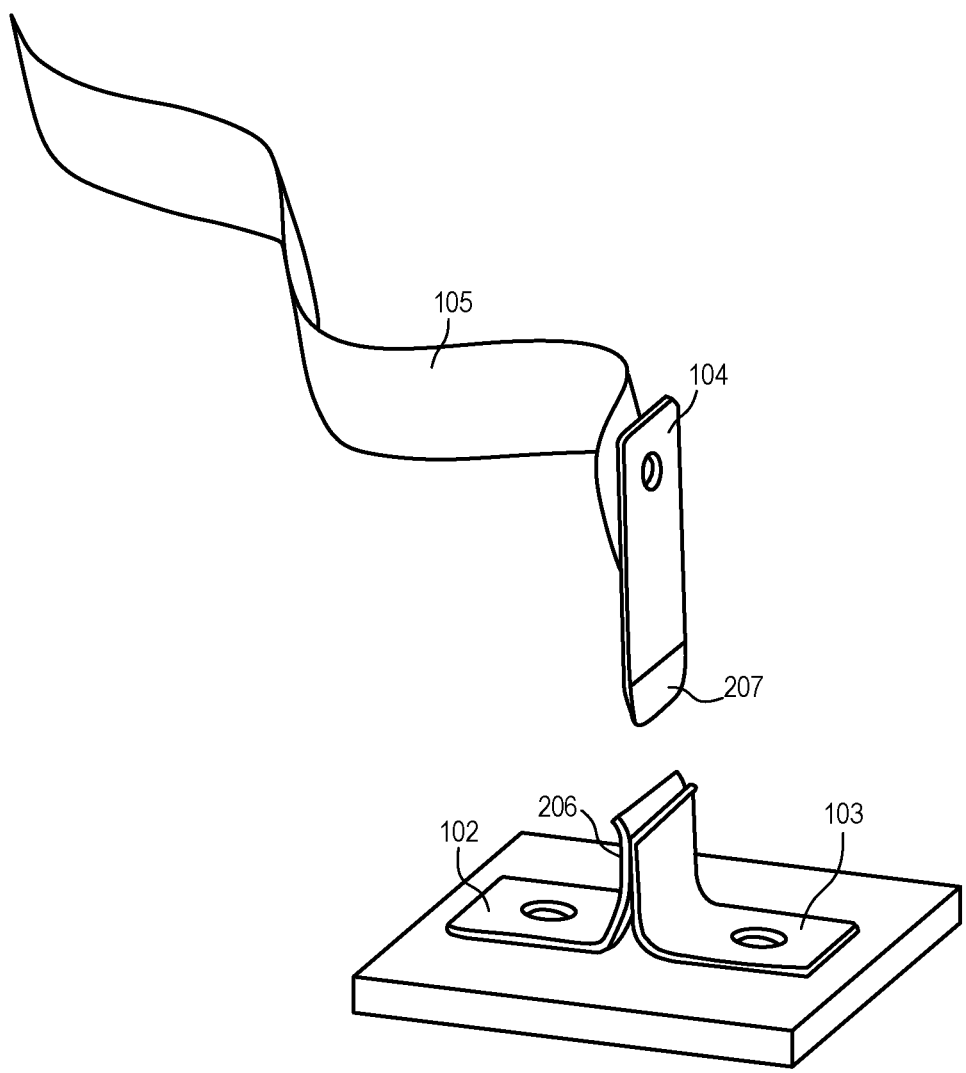

As illustrated in FIG. 3, once the installation is completed the installer would remove the blades 104 at all those places indicated by the flags 105. Once the blade 104 is removed, the spring loaded contactors 102 and 103 contact each other to provide an electric path from the photovoltaic cells to the output connectors of the photovoltaic panel.

If additional work or troubleshooting were needed, the blade(s) 104 and flag(s) 105 could be reinserted, aided by the tapered section 207 of the blade 104, thereby breaking the electrical continuity between the contactors 102 and 103 at point 206.

In some embodiments, there is symmetry in contactors 102 and 103. In other embodiments, the contactors 102 and 103 are not identical or even similar. The contactors 102 and 103 are made of electrically conductive material and configured to be in physical contact with each so that an electrically conductive path 206 is maintained, after the blade 104 is removed. In at least some embodiments, the electrical conductive path 206 is maintained without the blade 104 being inserted between the contactors 102 and 103, then disrupted by the blade 104 inserted between the contactors 102 and 103, and then reestablished by the reinsertions of a dielectric device such as the blade 104.

In addition to the visual indication of the modes of the panels provided by the flag(s) 105, the flags could also provide information in the form of text, such as, for example, "Remove before operation" or a warning of potentially lethal voltage.

Figure 4:
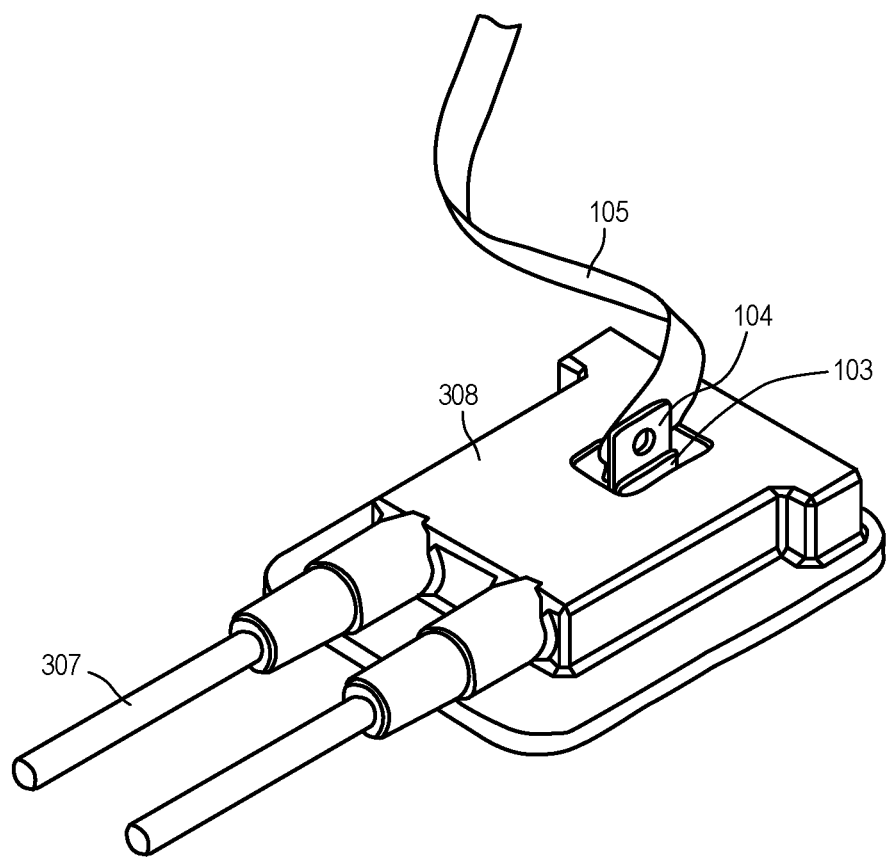

FIG. 4 illustrates a configuration of a spring loaded switch integrated with a junction box 308 of a photovoltaic panel. The junction box 308 includes a connector to connect the solar power generated by the photovoltaic panel to a load (e.g., an inverter, a voltage bus, etc.) via a cable 307. Thus, when the blade 104 is inserted into the switch, with the flag 105 visible, the voltage generated by the solar cells is isolated from the connector for the cable 307; and thus it is safe to install the photovoltaic panel or to perform maintenance operations on the photovoltaic panel.

Figure 5:
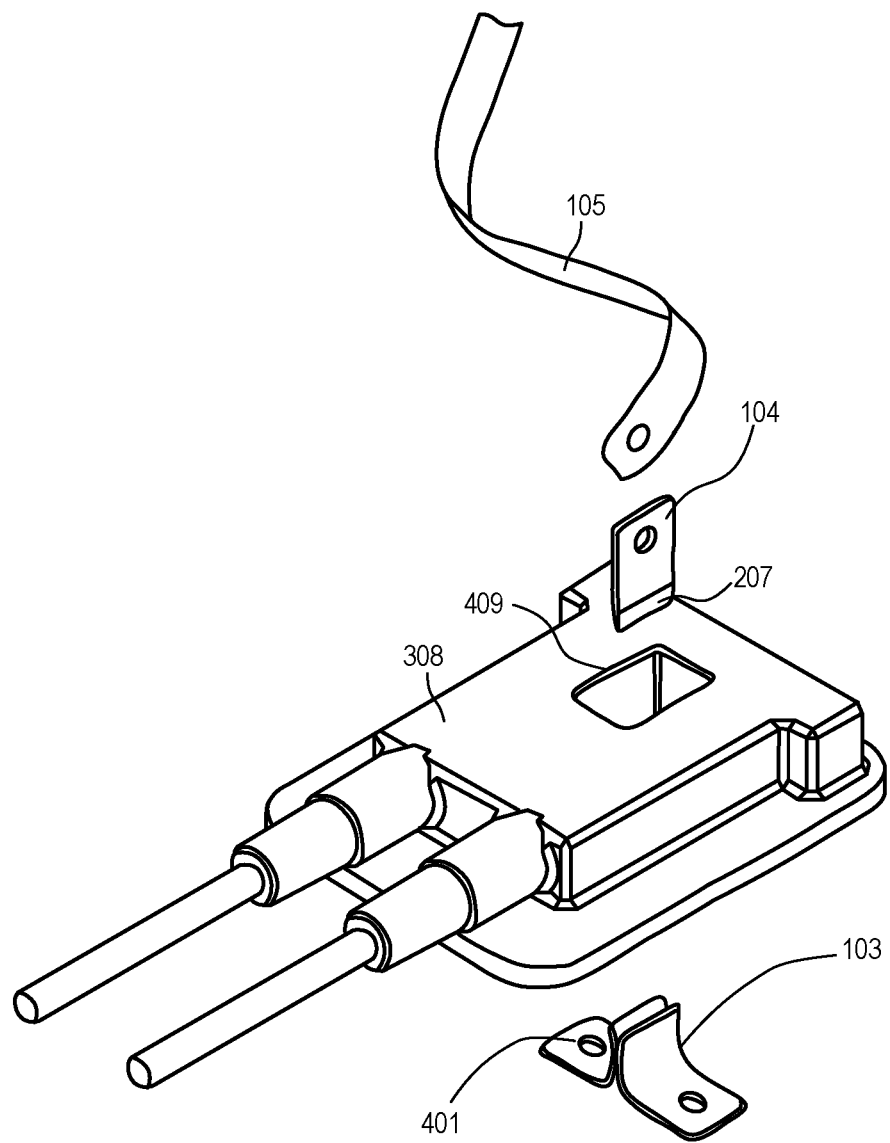

FIG. 5 shows the components of the spring loaded switch and the junction box of a photovoltaic panel. As illustrated in FIG. 5, the junction box 308 has an opening 409, which provides access to remove the blade 104 and/or to re-insert the blade 104. The contactors 103 of the switch can be attached to the junction box 308 via fastening the portion 401 to a supporting member of the junction box 308, such as a printed circuit board (PCB).

Figure 6:
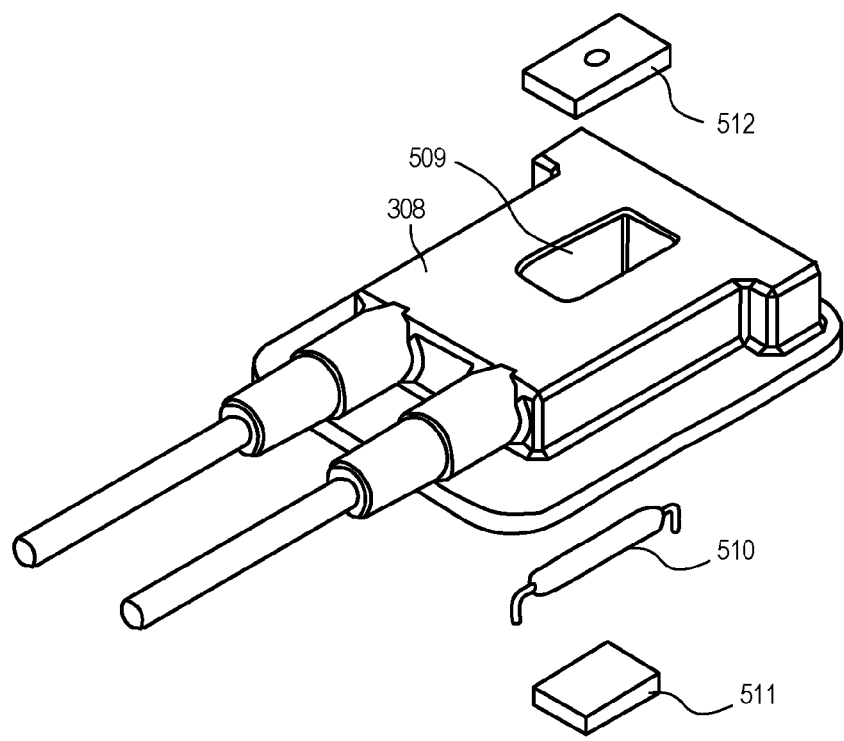
FIGS. 6-7 illustrate a junction box with a reed switch for a photovoltaic panel according to one embodiment.
Figure 7:
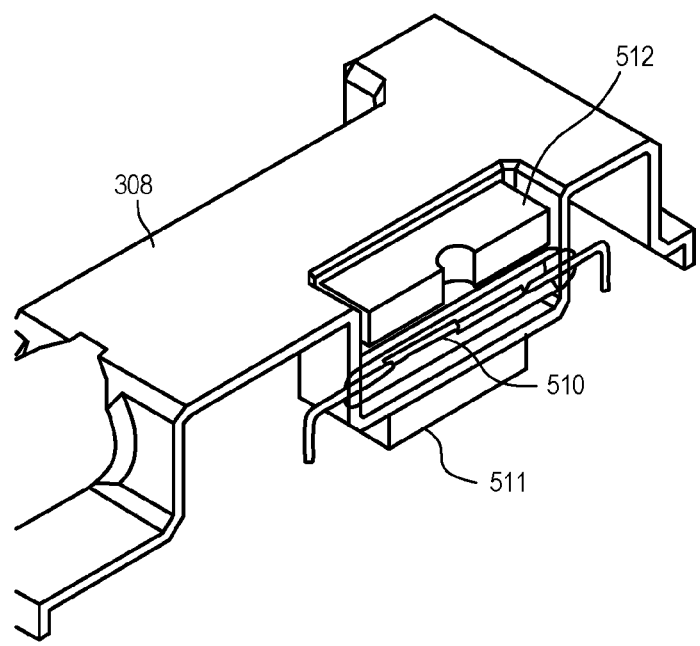

FIGS. 6 through 7 illustrate a junction box with a reed switch for a photovoltaic panel according to one embodiment. FIG. 6 shows an assembly of a reed switch 510 and magnets for integrated into the photovoltaic junction box 308. FIG. 7 shows a cut-away section illustrating the reed switch 510 and the magnets 511 and 512 installed within the portion 509 of the junction box 308.

In FIG. 7, a reed switch 510 is made normally closed by integrating a stationary biasing magnet 511 into the junction box 308 in close proximity to the normally open reed switch, so that the switch 510 is closed in absence of the magnet 512.

In one embodiment, the magnet 512 is inserted into the junction box well 509 so that the reversed polarity cancels the magnetic lines of force and the reed switch 510 opens.

In one embodiment, the magnet 512 is installed in the junction box well 509 at the factory; and a flag 105 (not shown in FIGS. 6 and 7) is attached to the magnet 512. The magnet 512 is removable and/or re-insertable via the junction box well 509.

In other embodiments, normally closed (NC) reed contacts can be used to replace the normally open (NO) reed contacts 510 and the magnet 511, avoiding the need for the additional stationary magnet.

Once the installation and integrations are complete the magnet 512 is removed and may be discarded. The power leads of the junction box 308 can then be energized via the semiconductor switch or relay (not shown), when the reed switch 512 is in the closed state.

In some cases, a semiconductor switch (not shown in FIG. 7) can be used to energize the power leads of the junction box 308. The panel junction box 308 or inverter (not shown in FIG. 7) may include a controller unit with a watch dog circuit configured to send a signal periodically (e.g., every time interval t) to maintain the connection of the panel outputs to the string. When this signal is timed-out or is absent, the panel outputs of the panel are disconnected via a semiconductor switch device (not shown).

Figure 8:
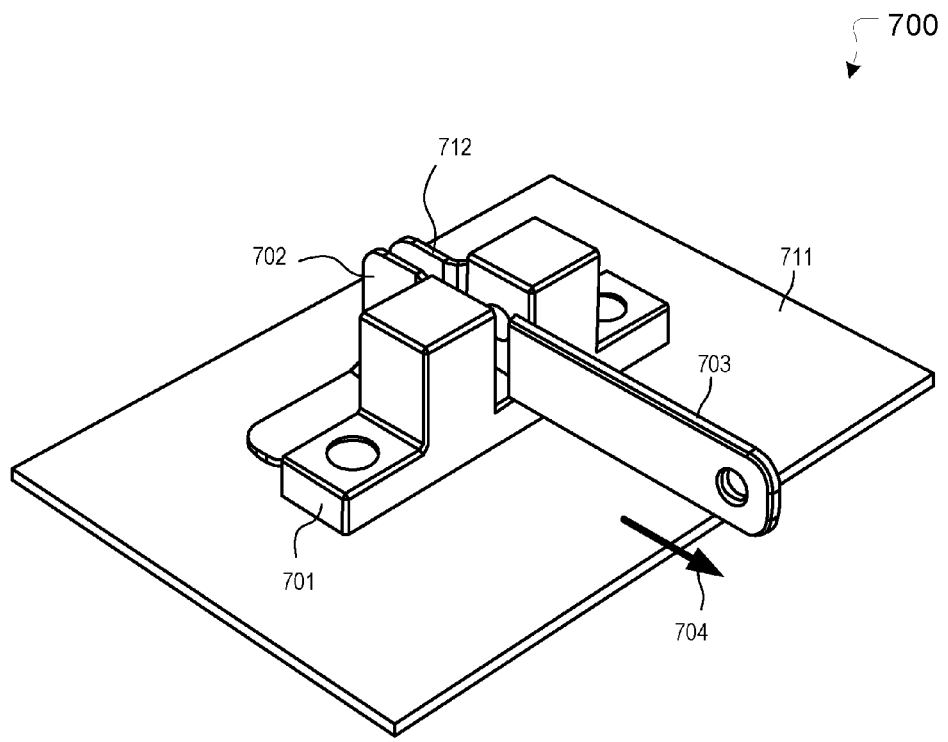
FIG. 8 illustrates an optical sensor to control a safety switch for a photovoltaic panel according to one embodiment.

FIG. 8 illustrates an optical sensor to control a safety switch for a photovoltaic panel according to one embodiment. In FIG. 8, an optical sensor unit 700 with an optical sensor 701 is mounted on a printed circuit board (PCB) 711. Additionally, springs 702 and 712 hold a separator 703 in place that can be removed in direction of arrow 704 using a pull-tab similar to the flag 105 discussed earlier. Not shown in FIG. 8 is the exterior enclosure that would contain the mechanical elements such as the cable connections and the guide elements for guiding separator 703 in and out of the unit.

In one embodiment, additional circuitry (not shown in FIG. 8) will be on the side of the PCB 711, such as a control circuit to affect an on/off switching either in some cases by FET (Field-Effect Transistor) transistors or using, in other cases, a relay, such as a bi-stable relay or another suitable circuit. The operational power may be drawn from the solar system itself, or it may be brought up by auxiliary wiring.

In yet some other embodiments, a relay can be simply remote controlled by an auxiliary wire to close or open the circuit. The advantage of this approach is that no pull-tabs (flags or blades) can be forgotten on the roof.

In one embodiment, a mechanism and/or circuitry is integrated in the panel to identify the load from the inverter and connect the panel to the panel outputs when the load is detected. When no load is present the panel outputs is disconnected. This functionality would also be implemented using a semiconductor switch device or other suitable device (such as a relay), and some sensor circuitry, allowing an automatic reconnect when the loop appears to be closed and a load connected.

Figure 9:
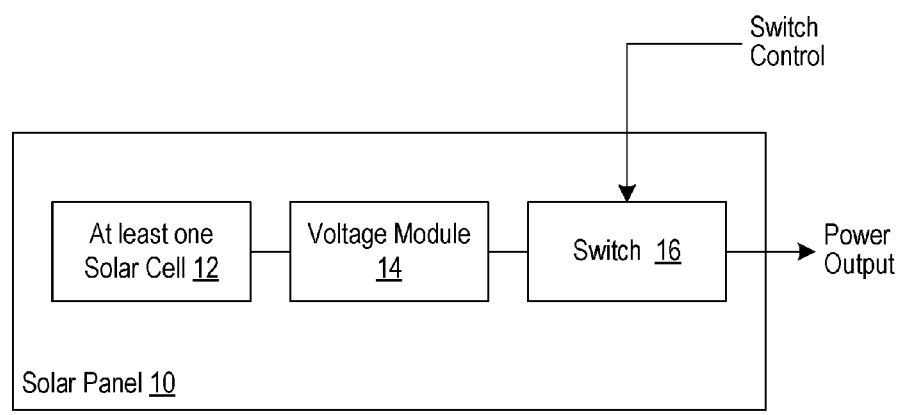
FIG. 9 illustrates a solar panel having a safety switch controlled via auxiliary wiring according to one embodiment.

FIG. 9 illustrates a solar panel having a safety switch controlled via auxiliary wiring according to one embodiment. In FIG. 9, a separate wire is connected to control the switch 16 from a remote location. For example, the switch may be controlled via a signal from a watch dog circuit, from a remote switch or controller, etc.

Balancing Solar Panels

When solar modules are connected in series or mesh configuration, there can be a problem in which weaker modules not only produce less energy but also affect other modules in the same string or wiring section. By measuring one can determine that a few modules are weaker than the others in most commercially installed strings. Thus, the string is generating less power than the sum available at each module if modules were operated separately.

At least one embodiment of the present disclosure provides methods and systems to switch on and off weak modules in the string in a way that the current on the string bus from the good modules won't be affected by the weak modules.

Figure 10:
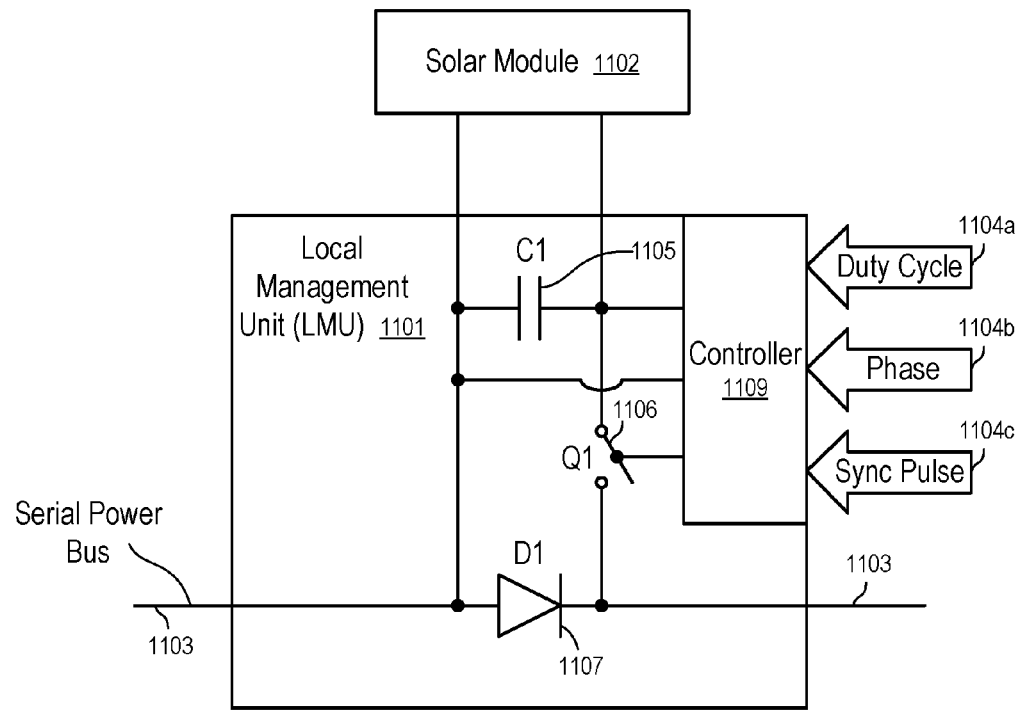
FIGS. 10-12 illustrate local management units according to some embodiments.
Figure 11:
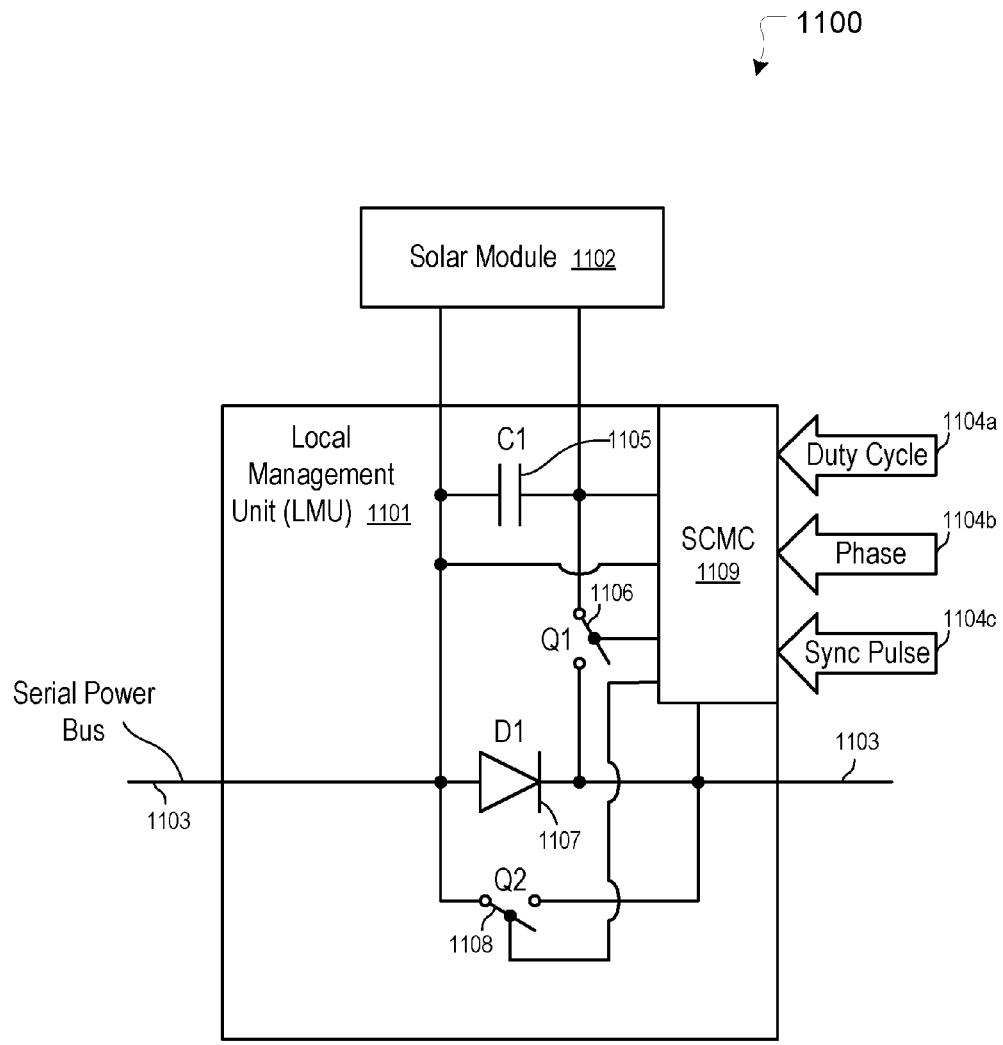
Figure 12:
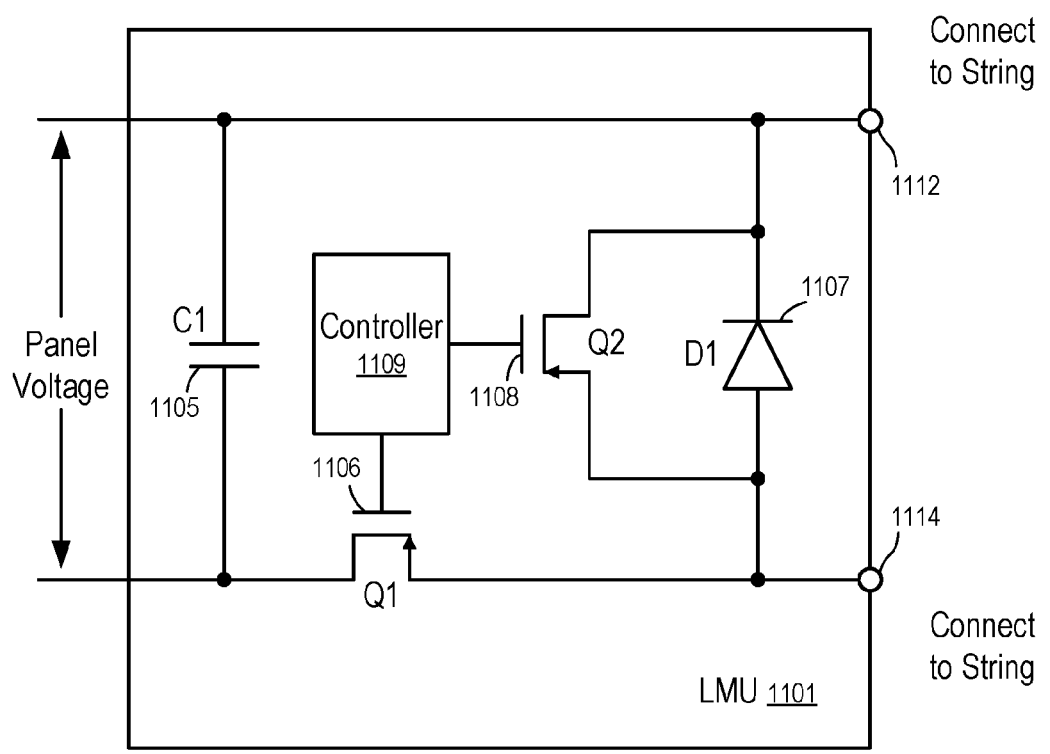

FIGS. 10 through 12 illustrate local management units according to some embodiments. In FIGS. 10 through 12, local management units (1101) are used to switch on and off the solar module (1102) periodically to improve the energy production performance of the photovoltaic systems connected, at least in part, in series.

In FIG. 10, a management unit (101) is local to the solar module (102) and can be used to periodically couple the solar module (102) to the serial power bus (103) via the switch Q1 (106), to improve the total power output for the string of solar modules connected to the serial power bus in series.

The local management unit (LMU) (1101) may include a solar module controller to control the operation of the solar module (1102) and/or a link module unit to provide connectivity to the serial power bus (1103) for energy delivery and/or for data communications.

In one embodiment, the command to control the operation of the switch Q1 (1106) is sent to the local management unit (1101) over the photovoltaic (PV) string bus (power line) (1103). Alternatively, separate network connections can be used to transmit the data and/or commands to/from the local management unit (1101).

In FIGS. 10 and 11, the inputs (1104a, 1104b, 1104c) to the local management unit (1101) are illustrated separately. However, the inputs (1104a, 1104b, 1104c) are not necessarily communicated to local management unit (1101) via separate connections. In one embodiment, the inputs are received in the local management unit via the serial power bus (1103).

In FIG. 10, the solar module (1102) is connected in parallel to the capacitor C1 (1105) of the local management unit (1101). The diode D1 (1107) of the local management unit (1101) is connected in series in the serial power bus (1103) which may or may not be part of an overall mesh configuration of solar modules. The switch Q1 (1106) of the local management unit can selectively connect or disconnect the solar module (102) and the capacitor C1 (1105) from a parallel connection with the diode D1 (1107) and thus connect or disconnect the solar module (1102) from the serial power bus (1103).

In FIG. 10, a controller (1109) of the local management unit (1101) controls the operation of the switch (1106) according to the parameters, such as duty cycle (1104a), phase (1104b) and synchronization pulse (1104c).

In one embodiment, the controller (1109) receives the parameters (1104a, 1104b, 1104c) from a remote management unit via the serial power bus (1103) or a separate data communication connection (e.g., a separate data bus or a wireless connection). In some embodiment, the controller (1109) may communicate with other local management units connected on the serial power bus (1103) to obtain operating parameters of the solar modules attached to the serial power bus (1103) and thus compute the parameters (e.g., 1104a and 1104b) based on the received operating parameters. In some embodiments, the controller (1109) may determine the parameter (e.g., 104a and 104b) based on the operating parameters of the solar module (1102) and/or measurements obtained by the controller (1109), without communicating with other local management units of other solar modules, or a remote system management unit.

In FIG. 11, a system (100) has a local management unit (1101) coupled to the solar module (1102). The local management unit (1101) is connected between the solar module (1102) and the string bus (1103) to improve the total power output for the whole string on the serial power bus (1103). Commands to the local management unit (1101) can be sent over the photovoltaic (PV) string bus (power line) (1103). To make the figure clearer, the inputs (1104a, 1104b, 1104c) to the controller (1109) of the local management unit (1101) are drawn separately, which does not necessarily indicate that the inputs (1104a, 1104b, 1104c) are provided via separate connections and/or from outside the local management unit (1101). For example, in some embodiments, the controller (1109) may compute the parameters (1104a, 1104b, 1104c) based on measurements obtained at the local management unit (1101), with or without data communications over the serial power bus (1103) (or a separate data communication connection with other management units).

In FIG. 11, the local management unit (1101) is connected in one side to the solar module (1102) in parallel and on the other side in series to a string of other modules, which may or may not be part of an overall mesh configuration. The local management unit (1101) may receive, among others, three inputs or types of input data, including a) requested duty cycle (1104a), which can be expressed as a percentage (e.g., from 0 to 100%) of time the solar module (1102) is to be connected to the serial power bus (1103) via the switch Q1 (1106), b) a phase shift (1104b) in degrees (e.g., from 0 degree to 180 degree) and c) a timing or synchronization pulse (1104c). These inputs (e.g., 1104a, 1104b and 1104c) can be supplied as discrete signals, or can be supplied as data on a network, or composite signals sent through the power lines or wirelessly, and in yet other cases, as a combination of any of these input types.

In FIG. 11, the local management unit (1101) periodically connects and disconnects the solar module (1102) to and from the string that forms the serial power bus (1103). The duty cycle (1104a) and the phase (1104b) of the operation of the switch Q1 (1106) can be computed in a number of ways to improve the performance of the system, which will be discussed further below.

In FIG. 11, the local management unit (1101) includes a capacitor C1 (1105) and a switch Q1 (1106), as well as a diode D1 (1107). In FIG. 11, the diode D1 (1107) is supplemented with an additional switch Q2 (1108), which acts as a synchronous rectifier to increase efficiency. In one embodiment, the additional switch Q2 (1108) is open (turned off) when the switch Q1 (1106) is closed (turned on) to attach the solar module (1102) (and the capacitor C1 (1105)) to the serial power bus (1103).

In some cases, a filter (not shown), including a serial coil and a parallel capacitor, is also used. The filter may be placed at the local management unit or placed just before the fuse box or inverter, or be part of either one of those.

In FIG. 11, the controller (1109) is used to process the input signals (e.g., 1104a, 1104b, 1104c) and drive the switches Q1 (1106) and Q2 (1108). In one embodiment, the controller (1109) is a small single chip micro controller (SCMC). For example, the controller (1109) may be implemented using Application-Specific Integrated Circuit (ASIC) or Field-Programmable Gate Array (FPGA). The controller (1109) can even be implemented in discrete, functionally equivalent circuitry, or in other cases a combination of SCMC and discrete circuitry.

In one embodiment, the controller (1109) is coupled to the solar module (1102) in parallel to obtain power for processing; and the controller (1109) is coupled to the serial power bus (1103) to obtain signals transmitted from other management units coupled to the serial power bus (1103).

By switching the module (1102) (or groups of cells, or a cell) on and off to the string periodically, the local management unit (1101) may lower the voltage reflected to the string bus (1103) (e.g., a lower average voltage contributed to the string bus) and can cause the current reflected to the string bus (1103) to be higher, nearer the level it would be if the module was not weak, generating a higher total power output.

In one embodiment, it is preferable to use different phases to operate the switches in different local management units on a string to minimize voltage variance on the string.

In FIG. 12, the local management unit (1101) provides two connectors (1112 and 1114) for serial connections with other local management unit (1101) to form a serial power bus (1103) (FIG. 11). The controller (1109) controls the states of the switches Q1 (1106) and Q2 (1108).

In FIG. 12, when the controller (1109) turns on the switch (1106), the panel voltage and the capacitor C1 (1105) are connected in parallel to the connectors (1112 and 1114). The output voltage between the connectors (1112 and 1114) is substantially the same as the output panel voltage.

In FIG. 12, during the period the switch (1106) is turned off (open), the controller (1109) turns on (closes) the switch (1108) to provide a path around the diode D1 (1107) to improve efficiency.

In FIG. 12, when the switch (1106) is turned off (open), the panel voltage charges the capacitor C1 (1105), such that when the switch (1106) is turned on, both the solar panel and the capacitor (1105) provides currents going through the connectors (1112 and 1114), allowing a current larger than the current of the solar panel to flow in the string (the serial power bus (1103)). When the switch (1106) is turned off (open), the diode D1 (1107) also provides a path between the connectors (1112 and 1114) to sustain the current in the string, even if the switch (1108) is off for some reasons.

In one embodiment, the controller (1109) is connected (not shown in FIG. 12) to the panel voltage to obtain the power for controlling the switches Q1 (1106) and Q2 (1108). In one embodiment, the controller (1109) is further connected (not shown in FIG. 12) to at least one of the connectors to transmit and/or receive information from the string. In one embodiment, the controller (1109) includes sensors (not shown in FIG. 12) to measure operating parameters of the solar panel, such as panel voltage, panel current, temperature, light intensity, etc.

Figure 13:
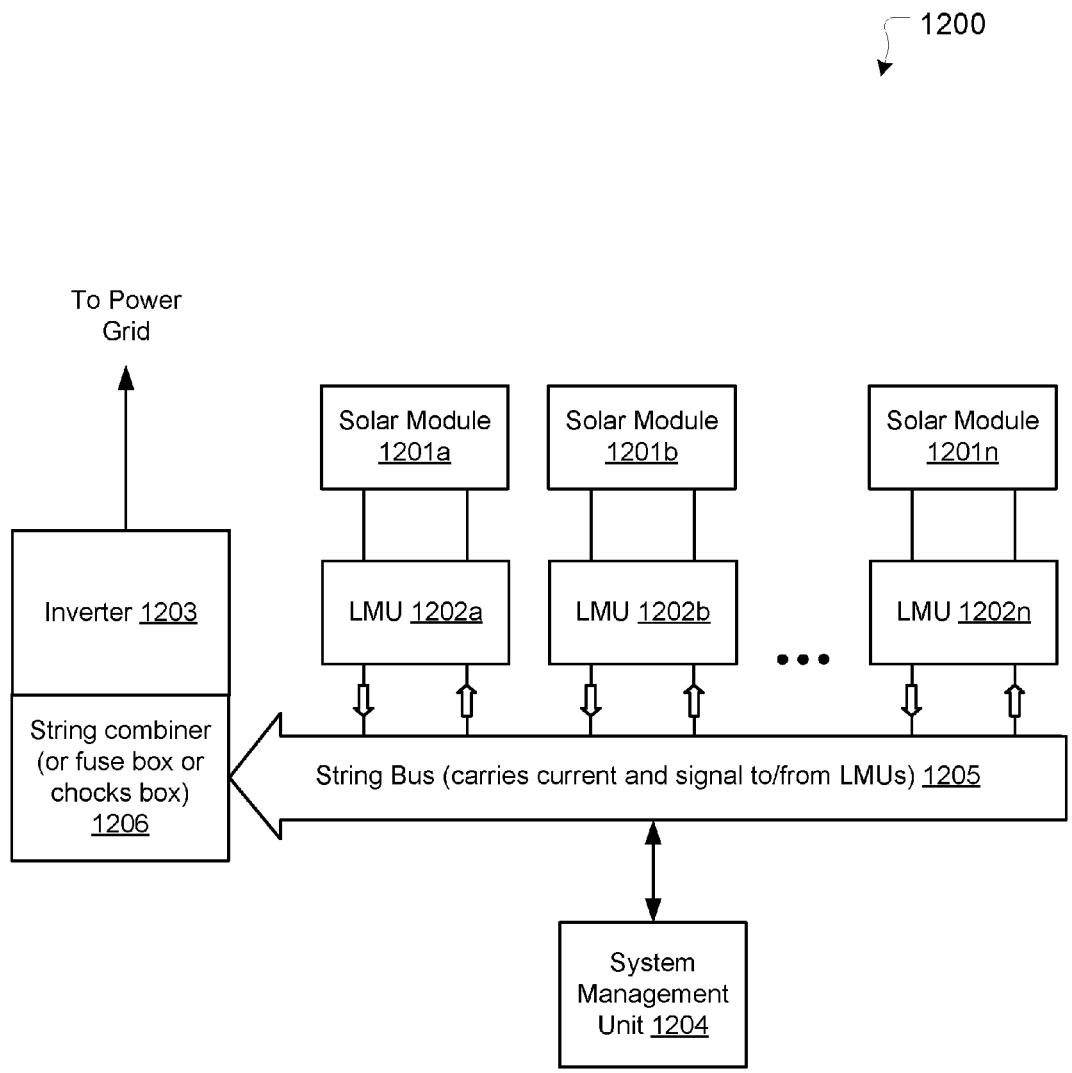
FIG. 13 illustrates a photovoltaic system according to one embodiment.

FIG. 13 illustrates a photovoltaic system (1200) according to one embodiment. In FIG. 13, the photovoltaic system 1200 is built from a few components, including photovoltaic modules (1201*a*, 1201*b*, . . . , 1201*n*), local management unit units (1202*a*, 1202*b*, . . . , 1202*n*), an inverter (1203), and a system management unit (1204).

In one embodiment, the system management unit (1204) is part of the inverter (1203), the combiner box (1206), a local management unit, or a stand-alone unit. The solar modules (1201*a*, 1201*b*, . . . , 1201*n*) are connected in parallel to the local management unit units (1202*a*, 1202*b*, . . . , 1202*n*) respectively, which are connected in series to form a string bus (1205), which eventually is connected to an inverter (1203) and the system management unit (1204).

In FIG. 13, the string bus (1205) can be connected to the inverter (1203) directly or as part of a mesh network or combiner boxes or fuse boxes (not shown). An isolated local management unit can be used as a combiner box (1206) to adjust all voltages before connecting to the inverter (1206); or, a single or multi-string inverter can be used. To limit the changes in the voltage of the bus, the system management unit (1204) may assign a different phase for each of the local management units (1202*a*, 1202*b*, . . . , 1202*n*). In one embodiment, at any given time, a maximum of a predetermined number of solar modules (e.g., one single solar module) are disconnected from the string bus (1205).

In one embodiment, beyond the module connection the local management units can have the signal inputs, including but not limited to duty cycle (1104*a*), phase (1104*b*) and synchronization pulse (1104*c*) (e.g., to keep the local management units synchronized). In one embodiment, the phase (1104*b*) and the synchronization pulse (1104*c*) are used to further improve performance, but the local management unit (1101) can work without them.

In one embodiment, the local management unit may provide output signals. For example, the local management unit (1101) may measure current and voltage at the module side and optionally measure current and voltage in the string side. The local management unit (1101) may provide other suitable signals, including but not limited to measurements of light, temperature (both ambient and module), etc.

In one embodiment, the output signals from the local management unit (1101) are transmitted over the power line (e.g., via power line communication (PLC)), or transmitted wirelessly.

In one embodiment, the system management unit (1204) receives sensor inputs from light sensor(s), temperature sensor(s), one or more each for ambient, solar module or both, to control the photovoltaic system (1200). In one embodiment, the signals may also include synchronization signals. For example, a using the described methods the local management unit can be a very non-expensive and reliable device that can easily increase the throughput of a photovoltaic solar system by a few (e.g., signal or low double digits) percentage points. These varied controls also allow installers using this kind of system to control the VOC (open circuit voltage) by, for example by shutting off some or all modules. For example, by using the local management units of the system, a few modules can be disconnected from a string if a string is getting to the regulatory voltage limit, thus more modules can be installed in a string.

In some embodiments, local management units can also be used within the solar panel to control the connection of solar cells attached to strings of cells within the solar panel.

Figure 14:
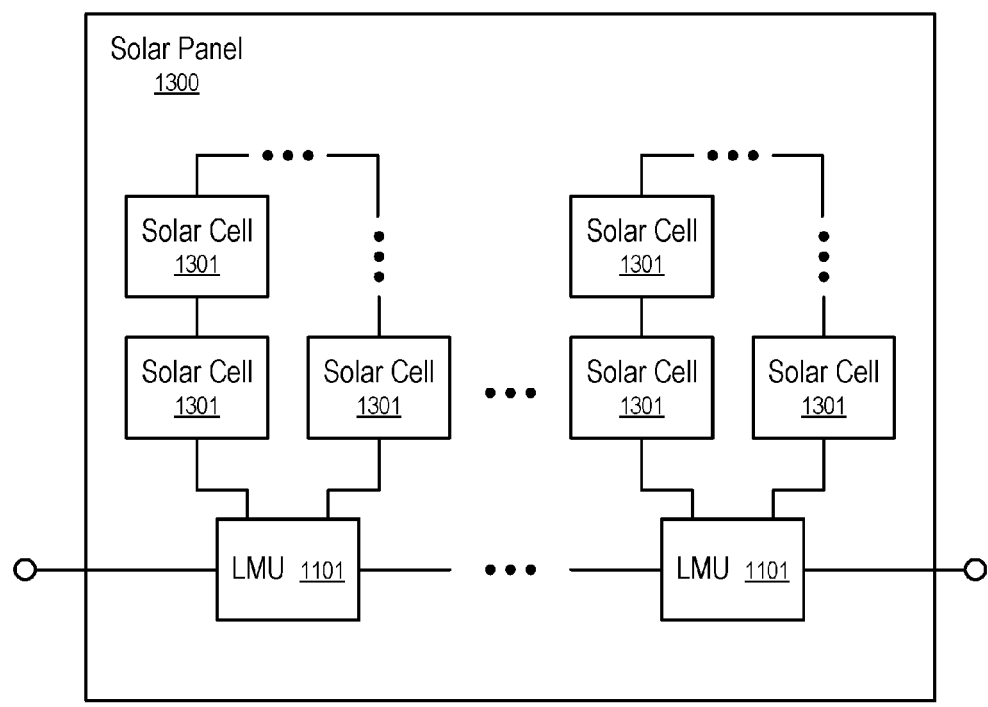
FIG. 14 illustrates a solar panel according to one embodiment.

FIG. 14 illustrates a solar panel according to one embodiment. In one embodiment, the solar panel (1300) has a few strings of solar cells (e.g., three solar cell strings per module). In FIG. 14, a local management unit (1101) can be applied to a group of cells (1301) within a string of an individual solar panel (1300), or in some cases to each cell (1301) in a solar panel (1300).

In FIG. 14, a group of solar cells (1301) that are attached to a local management unit (1101) may be connected to each other in series, in parallel, or in a mesh configure. A number of local management units (1101) connect the groups of the solar cells (1301) in a string to provide output for the solar panel (1300).

Some embodiments of the disclosure includes methods to determine the duty cycles and/or phases for local management units connected to a string or mesh of solar modules.

In some embodiments, the duty cycle of all local management units in a string or mesh can be changed, to increase or decrease the string voltage. The duty cycles may be adjusted to avoid exceeding the maximum voltage allowed. For example, the maximum voltage may be limited by the combiner box (1206), the inverter (1203), or any other load connected to the string bus (1205), or limited by any regulations applicable to that system. In some embodiments, the duty cycles are adjusted to align the voltage of multiple strings.

In some embodiments, the duty cycle of one local management unit (1101) in a string can be changed to cause higher current in that local management unit (1101) and overall higher power harvesting.

In one embodiment, the duty cycles are computed for the solar modules that are connected to a string via the corresponding local management units. The duty cycles can be calculated based on the measured current and voltages of the solar modules and/or the temperatures.

After an initial set of duty cycles is applied to the solar modules, the duty cycles can be further fine-tuned and/or re-adjusted to changes, such as shifting shading etc., one step at a time, to improve power performance (e.g., to increase power output, to increase voltage, to increase current, etc.). In one embodiment, target voltages are computed for the solar modules, and the duty cycles are adjusted to drive the module voltage towards the target voltages.

The methods to compute the duty cycles of the solar modules can also be used to compute the duty cycles of the groups of solar cells within a solar module.

Figure 15:
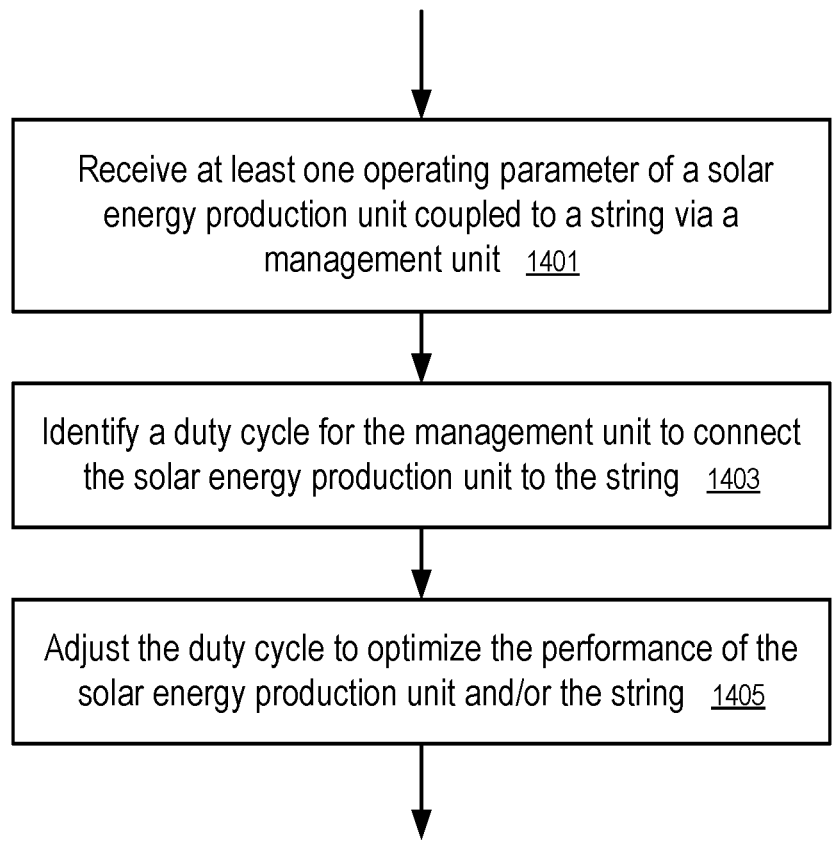
FIGS. 15-17 show methods to improve performance of a photovoltaic system according to some embodiments.
Figure 16:
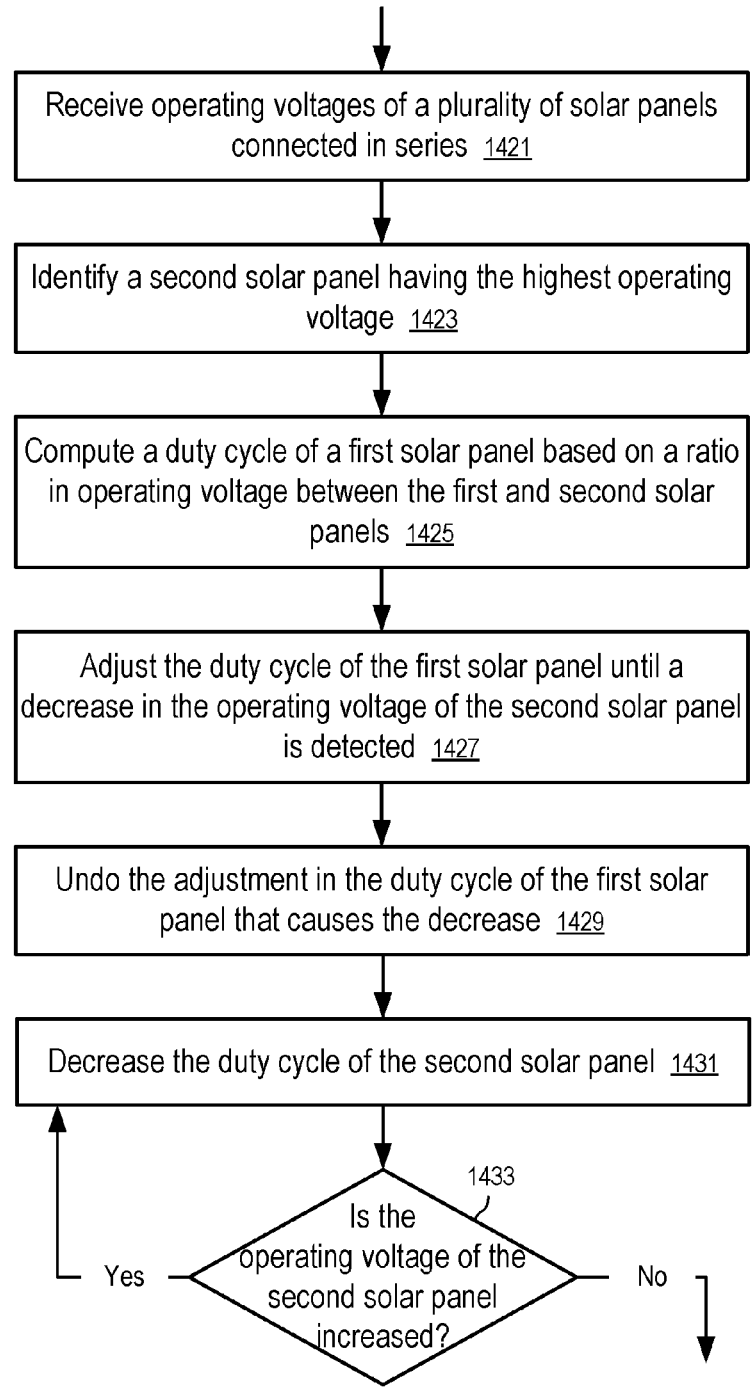
Figure 17:
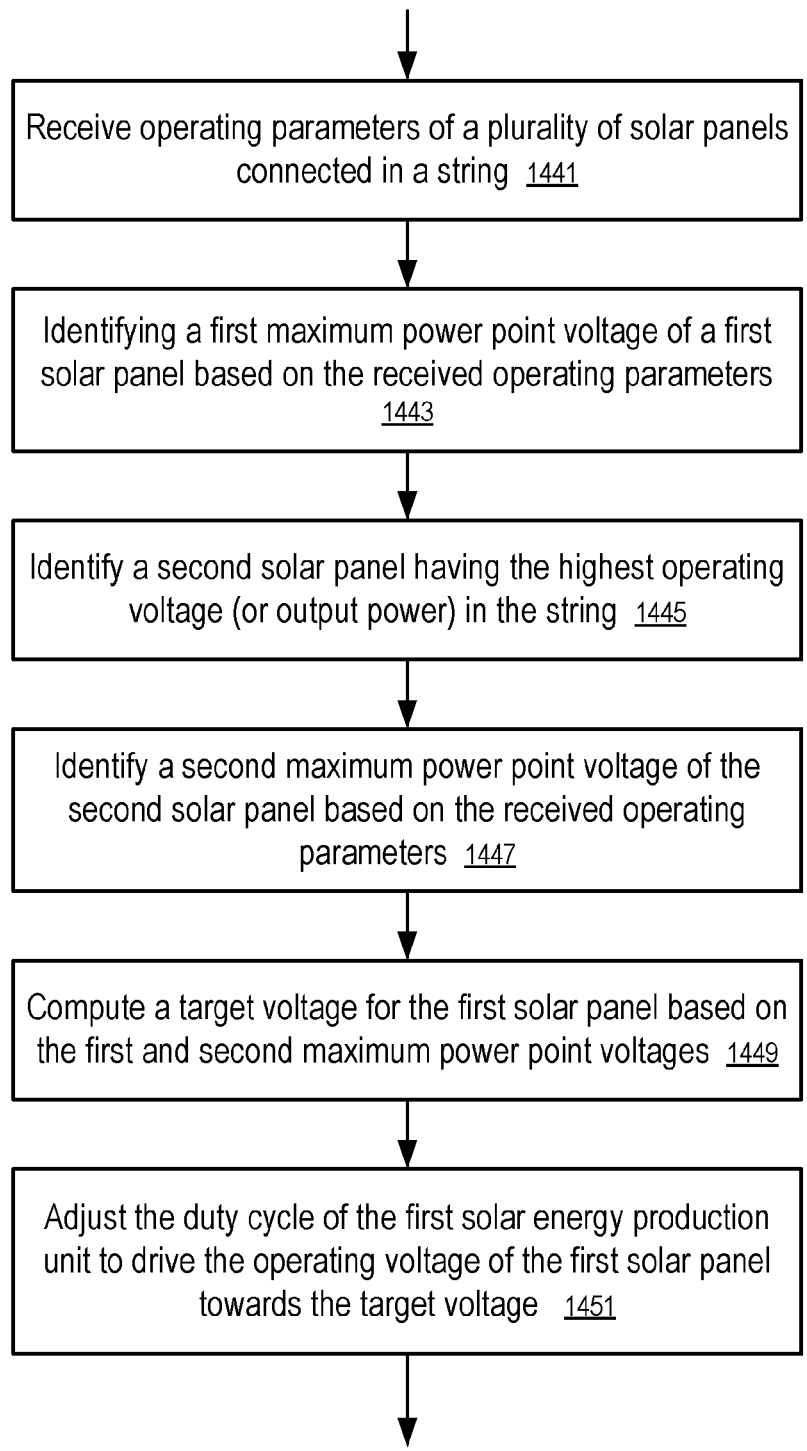

FIGS. 15 through 17 show methods to improve performance of a photovoltaic system according to some embodiments.

In FIG. 15, at least one operating parameter of a solar energy production unit coupled to a string via a management unit is received (1401) and used to identify (1403) a duty cycle for the management unit to connect the solar energy production unit to string. The solar energy production unit may be a solar module, a group of solar cells within a solar module, or a single solar cell in a string in a solar module. The duty cycle is adjusted (1405) to optimize the performance of the solar energy production unit and/or the string.

For example, the duty cycle can be adjusted to increase the current in the string and/or the solar energy production unit, to increase the output power of the string and/or the solar energy production unit, to increase the voltage of the solar energy production unit, etc.

In FIG. 16, the operating voltages of a plurality of solar panels connected in series are received (1421) and used to identify (1423) a second solar panel having the highest operating voltage (highest output power) in the string.

In FIG. 16, a duty cycle of a first solar panel is computed (1425) based on a ratio in operating voltage between the first and second solar panels. Alternatively, the duty cycle can be computed based on a ratio in output power between the first and second solar panels. Alternatively, the duty cycle can be computed based on a ratio between the first and second solar panels in estimated/computed maximum power point voltage. Alternatively, the duty cycle can be computed based on a ratio between the first and second solar panels in estimated/computed maximum power point power.

The duty cycle of the first solar panel is adjusted (1427) to improve the performance of the first solar energy production unit and/or the string, until a decrease in the operating voltage of the second solar panel is detected. For example, the duty cycle of the first solar panel can be adjusted to increase the total output power of the string, to increase the current of the string, to increase the current of the first solar panel, to drive the voltage of the first solar panel towards a target voltage, such as its maximum power point voltage estimated based on its current operating parameters, such as temperature or a voltage calculated using its estimated maximum power point voltage.

In FIG. 16, in response to the detected decrease in the operating voltage of the second solar panel which had the highest operating voltage, the adjustment in the duty cycle of the first solar panel that causes the decrease is undone/reversed (1429).

In FIG. 16, the duty cycle of the second solar panel is optionally decreased (1431) to increase the operating voltage of the second solar panel. In some embodiments, the strongest solar panel (or strong panels within a threshold from the strongest panel) is not switched off line (e.g., to have a predetermined duty cycle of 100%).

In one embodiment, the duty cycle of the second solar panel is repeatedly decreased (1429) until it is determined (1431) that the decrease (1429) in the duty cycle of the second solar panel cannot increase the voltage of the second solar panel.

In FIG. 17, operating parameters of a plurality of solar panels connected in a string are received (1441) and used to identify (1443) a first maximum power point voltage of a first solar panel. A second solar panel having the highest operating voltage (or output power) in the string is identified. A second maximum power point voltage of the second solar panel is identified (1447) based on the received operating parameters and used to compute (1449) a target voltage for the first solar energy production unit. In one embodiment, the target voltage is a function of the first and second maximum power point voltages and the highest operating voltage identified (1445) in the second solar panel in the string. The duty cycle of the first solar energy production unit is adjusted to drive the operating voltage of the first solar panel towards the target voltage.

Alternatively, the target voltage may be the set as the first maximum power point voltage of the first solar panel.

In one embodiment, to adjust voltage a same factor is applied to all modules in that string. For example, in a case of a first module A1 that is producing only 80%, and the voltage of the whole string needs to be 5% lower, the duty cycle of A1 is 80% multiplied the duty cycle applied to the whole string (which is Y in this example) so module A1 then has Y×0.8 as duty cycle.

In some embodiments, the system management unit (1204) and/or the local management units (e.g., 1202a, 1202b, . . . , 1202n) are used solely or in combination to determine the parameters to control the operations of the switches.

For example, in one embodiment, a system management unit (1204) is the "brain" of the system, which decides on the duty cycle and phase parameters.

For example, in another embodiment, each local management unit broadcasts information to the other local management units on the string to allow the individual local management units to decide their own duty cycle and phase parameters.

In some embodiment, a local management unit may instruct one or more other local management units to adjust duty cycle and phase parameters. For example, the local management units on a string bus (1205) may elect one local management unit to compute the duty cycle and phase parameters for other local management units on the string.

For example, in some embodiment, the system management unit (1204) may determine one or more global parameters (e.g., a global duty cycle, the maximum power on the string, the maximum voltage on the string, etc.), based on which individual local management units adjust their own duty cycles.

In some embodiments, a local management unit may determine its own duty cycles without relying upon communicating with other management units. For example, the local management unit may adjust its duty cycle for connecting its solar module to the string to operate the solar module at the maximum power point.

In one embodiment, module voltage are measured by the local management units in the same string at substantially/approximately the same time and used to identify the strongest solar module. A strongest solar module provides the most power in the string. Since the modules are connected in series, the solar module having the highest module voltage in the string can be identified as the strongest solar module. In some embodiment, the operating voltage and current of the solar module are measured to determine the power of the solar module.

In one embodiment, after the highest module voltage Vm in the string is identified, the duty cycle for each module can be computed as a function of a ratio between the module voltage V of the module and the highest module voltage Vm. For example, the duty cycle for a module can be computed as $1-((Vm-V)/Vm)=V/Vm$.

In one embodiment, the system management (1204) may identify the highest module voltage from the module voltages received from the local management units (1202a, 1202b, ..., 1202n), and compute the duty cycles for the corresponding local management units (1202a, 1202b, ..., 1202n).

In one embodiment, the local management units (1202a, 1202b, ..., 1202n) may report their module voltages on the string bus (1205) to allow individual local management units (1202a, 1202b, ..., 1202n) to identify the highest module voltage and compute the duty cycles, without relying upon the system management unit (1204).

In one embodiment, one of the local management units (1202a, 1202b, 1202n) may identify the highest module voltage and/or compute the duty cycles for the other local management units (1202a, 1202b, ..., 1202n).

In one embodiment, the duty cycles are determined and/or adjusted periodically.

In one embodiment, after the duty cycles for the solar modules on the string are set based on the module voltage ratio relative to the highest module voltage in the string, the duty cycles can be fine tuned to increase the power performance. The duty cycles can be fine tuned one step at a time, until a decrease of voltage of the module with the highest power is detected. In response to the detected decrease, the last change that caused the decrease can be reversed (undone). The fine tuning of the duty cycles can be used to reach the peak performance point (e.g., for maximum power point tracking).

In one embodiment, after the strongest module is identified, the duty cycles of the solar modules on the string are adjusted until the module with the highest power in the string decrease its voltage. Since decreasing the duty cycle of a solar module decreases the time period the module is connected to the string and thus increases its voltage, the duty cycle of the module with the highest power in the string can be decreased to increase its voltage, in response to the decrease in its voltage caused by the adjustment to the duty cycles of other solar modules on the string. For example, the duty cycle of the module with the highest power in the string can be decreased until its voltage is maximized.

In one embodiment, the local management unit measures module and ambient temperatures for some methods to determine the duty cycles. For example, the operating parameters measured at the local management units (e.g., 1202a, 1202b, ..., 1202n), such as module temperature, can be used compute the estimated voltages of the solar modules at their maximum power points. For example, a formula presented by Nalin K. Gautam and N. D. Kaushika in "An efficient algorithm to simulate the electrical performance of solar photovoltaic arrays", Energy, Volume 27, Issue 4, April 2002, pages 347-261, can be used to compute the voltage Vmp of a solar module at the maximum power point. Other formulae can also be used. Once the maximum power point voltage Vmp of a solar module is computed or estimated, the duty cycle of the solar module connected to a string can be adjusted to drive the module voltage to the computed/estimated maximum power point voltage Vmp, since decreasing the duty cycle of a solar module normally increases its voltage.

In one embodiment, a local management unit may adjust the duty cycle of the solar module connected to the local management unit to change the module voltage to the computed/estimated maximum power point voltage Vmp, without having to communicating with other management units.

In one embodiment, a local management unit (or a system management unit) may adjust the duty cycle of the solar module connected to the local management unit to perform maximum power point tracking.

In one embodiment, after identifying the strongest module and computing/estimating the maximum power point voltage Vmpm of the strongest module, the duty cycle for each module on a string can be computed as a function of a ratio between the maximum power point voltage Vmp of the module and the maximum power point voltage Vmpm of the strongest module. For example, the duty cycle for a module can be computed as $1-((Vmpm-Vmp)/Vmpm)=Vmp/Vmpm$. The duty cycle can be periodically updated, based on the current operating parameters measured, and/or fine tuned until a decrease in the voltage of the strongest module is detected.

Alternatively, a target voltage for each module on the string can be computed as a function of a ratio between the maximum power point voltage Vmp of the module and the maximum power point voltage Vmpm of the strongest module. For example, the target voltage for a module can be computed as $Vm \times Vmp/Vmpm$, where Vm is the measured voltage of the strongest module. The duty cycle of the module can be changed to drive the module voltage of the module towards the target voltage.

In one embodiment, after identifying the strongest module and computing/estimating the maximum power point power Pmpm of the strongest module, the duty cycle for each module on a string can be computed as a function of a ratio between the maximum power point power Pmp of the module and the maximum power point power Pmpm of the strongest module. For example, the duty cycle for a module can be computed as $1-((Pmpm-Pmp)/Pmpm)=Pmp/Pmpm$. The duty cycle can be periodically updated, based on the current operating parameters measured, and/or fine tuned until a decrease in the voltage of the strongest module is detected, since decreasing the duty cycle normally increases the module voltage.

In one embodiment, a target voltage for each module on the string can be computed as a function of a ratio between the maximum power point power Pmp of the module and the maximum power point power Pmpm of the strongest module. For example, the target voltage for a module can be computed as $Vm \times Pmp/Pmpm$, where Vm is the measured voltage of the strongest module. The duty cycle of the module can be changed to drive the module voltage of the module towards the target voltage, since decreasing the duty cycle normally increases the module voltage.

In one embodiment, the duty cycle for each local management unit is changed to increase the current of the solar module attached to the local management unit (e.g., based on the measurement of the voltage and current of the solar module), until the maximum current is achieved. This method assumes that string maximum power can be achieved with some accuracy by driving each local management unit to maximum current. In one embodiment, the voltages and currents of the solar modules are measured for tuning the duty cycles for maximum power point tracking for the string. The measurements of the voltages and currents of the solar modules also enable the local management units to additionally serve as a module level monitoring system.

The duty cycles can be adjusted by the system management unit (e.g., 1204) based on the measurements reported by the local management units (e.g., 1202a, 1202b, ..., 1202n), or adjusted directly by the corresponding local management units (e.g., 1202a, 1202b, ..., 1202n).

In one embodiment, during the process of setting and/or tuning the duty cycles, the maximum power point tracking operation by the inverter (1203) is frozen (temporarily stopped). Light intensity at the solar modules is monitored for changes. When the light intensity at the solar modules stabilizes, the voltage and current of the solar modules are measured for the determination of the duty cycles. Then normal operation resumes (e.g., unfreezing of maximum power point tracking operation).

In one embodiment, the local management units measure the voltages and currents of the solar modules to determine the power of the solar modules. After identifying the highest power Pm of the solar module on the string, the duty cycles of the solar modules on the string are determined by the power radio relative to the highest power Pm. For example, if a module produces 20 percent less power, it will be disconnected from the string bus about 20 percent of the time. For example, if a module produces power P, its duty cycle can be set to 1−((Pm−P)/Pm)=P/Pm.

In one embodiment, a predetermined threshold is used to select the weak modules to apply duty cycles. For example, in one embodiment, when a module produces power less than a predetermine percent of highest power Pm, a duty cycle is calculated and applied to the solar module. If the module is above the threshold, the module is not disconnected (and thus having a duty cycle of 100%). The threshold may be based on the power, or based on the module voltage.

In one embodiment, the system management unit (1204) finds the duty cycles for the local management units (1202a, 1202b, ..., 1202n) and transmits data and/or signals representing the duty cycles to the local management units (1202a, 1202b, ..., 1202n) via wires or wireless connections. Alternatively, the local management units (1202a, 1202b, ..., 1202n) may communicate with each other to obtain the parameters to calculate the duty cycles.

In one embodiment, the system management unit (1204) knows all the different duty cycles indicated for the local management units (1202a, 1202b, ..., 1202n).

In one embodiment, during power fine tuning, the system management unit (1204) sends the appropriate data/signal to the appropriate local management units (1202a, 1202b, ..., 1202n), and then the system management unit (1204) calculates the total power of the string and corrects the duty cycle to produce maximum power. Once maximum power is achieved, the duty cycles for the local management units (1202a, 1202b, ..., 1202n) may be saved in a database and serve as a starting point for the corresponding local management units (1202a, 1202b, ..., 1202n) at the same time of day on the next day. Alternatively, a local management may store the duty cycle in its memory for the next day.

The stored duty cycles can be used when there is a fixed shade on the modules, such as a chimney, a tree, etc., which will be the same shade on any day at the same time. Alternatively, historical data may not be saved, but may be recalculated from scratch on each run, for example every 30 minutes.

In one embodiment, the light intensity at the solar modules is monitored for changes. The duty cycles are calculated when the light intensity does not change significantly. If there are changes in sun light radiation at the solar modules, the system will wait until the environment stabilizes before applying or adjusting the duty cycles.

In one embodiment, the system management unit (1204) can communicate with the inverter as well. When the environment is not stable (e.g., when the sun light radiation is changing), the inverter may stop maximum power point tracking. In such a situation, the inverter can be set up for its load, instead of tracking for maximum power point. Instead of using the inverter to perform maximum power point tracking, the system management unit (1204) and the local management units (1202a, 1202b, ..., 1202n) are used to set the operating parameters and balance the string.

Alternatively, when the environment is not stable but measurements and calculation are done faster than the MPPT is working, there may be no need to stop the MPPT on the inverter. Alternatively, when the environment is not stable, measurements can be taken few times for the same radiation until a stable result is achieved.

Many variations may be applied to the systems and methods, without departing from the spirit of the invention. For example, additional components may be added, or components may be replaced. For example, rather than using a capacitor as primary energy store, an inductor may be used, or a combination of inductor and capacitor. Also, the balance between hardware and firmware in the microcontrollers or processors can be changed, without departing from the spirit of the invention. In some cases, only some problematic modules may have a local management unit, for example in a shaded or partially shaded or otherwise different situation. In yet other cases, local management units of strong modules may be virtually shut off. The methods for determining the duty cycles for the solar modules can also be used to determine the duty cycles of groups of cells connected via local management units in a string within a solar panel/module.

Enhanced Watch Dog

What is needed is a system and method for an enhanced "watch dog" device that can implement an emergency shut down of the solar panel system when it detects a problem at the head end or in the wiring, thus maintaining the system in a safe condition.

Figure 18:
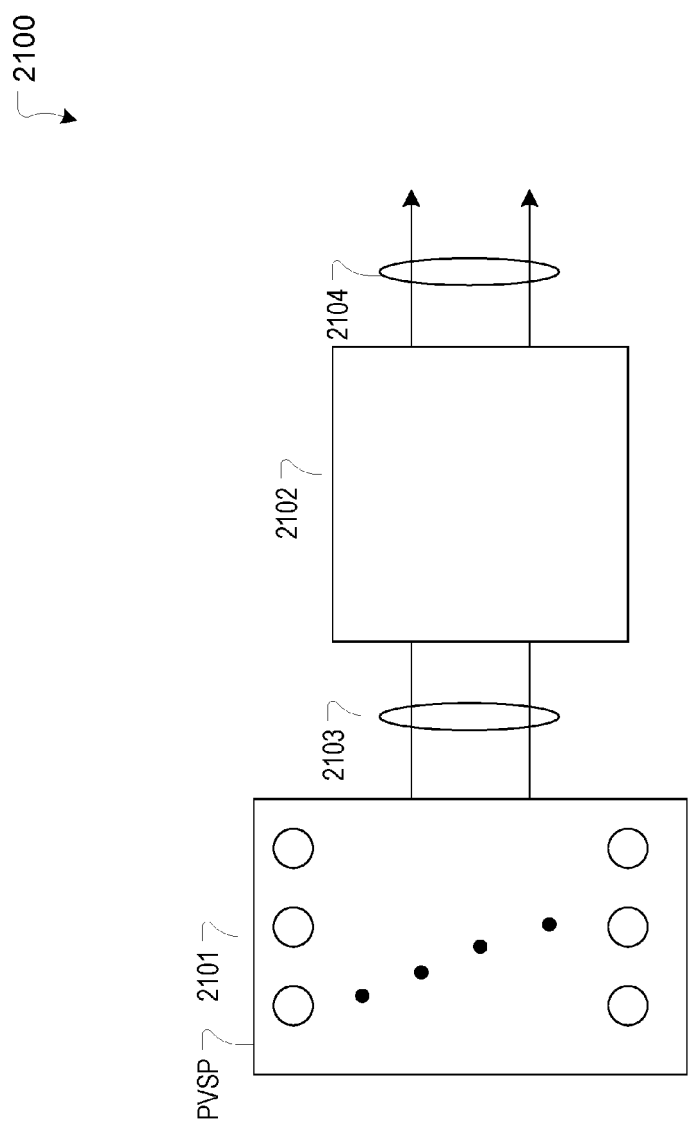
FIG. 18 illustrates an embodiment of an energy production system including a plurality of junction boxes each coupled between a solar module and a power bus.

FIG. 18 shows an overview of an exemplary photovoltaic power system 2100 known to the inventors. Photovoltaic solar panel (PVSP) 101 typically connects via wires 2103, such pigtail wires, to a junction box 2102, which in turn connects the wiring 2104 to the wiring system, typically as part of a string of panels, or a high voltage box, to a combiner box (essentially a wiring panel) and from there on to an inverter feeding the power grid. In this example the watch dog is in junction box 2102; in other cases the watch dog may be in other locations in the wiring further down the line, such as, for example, in the combiner box that combines wires of multiple panels and/or strings, or it may be in an inverter box that combines multiple wirings and the inverter.

Figure 19:
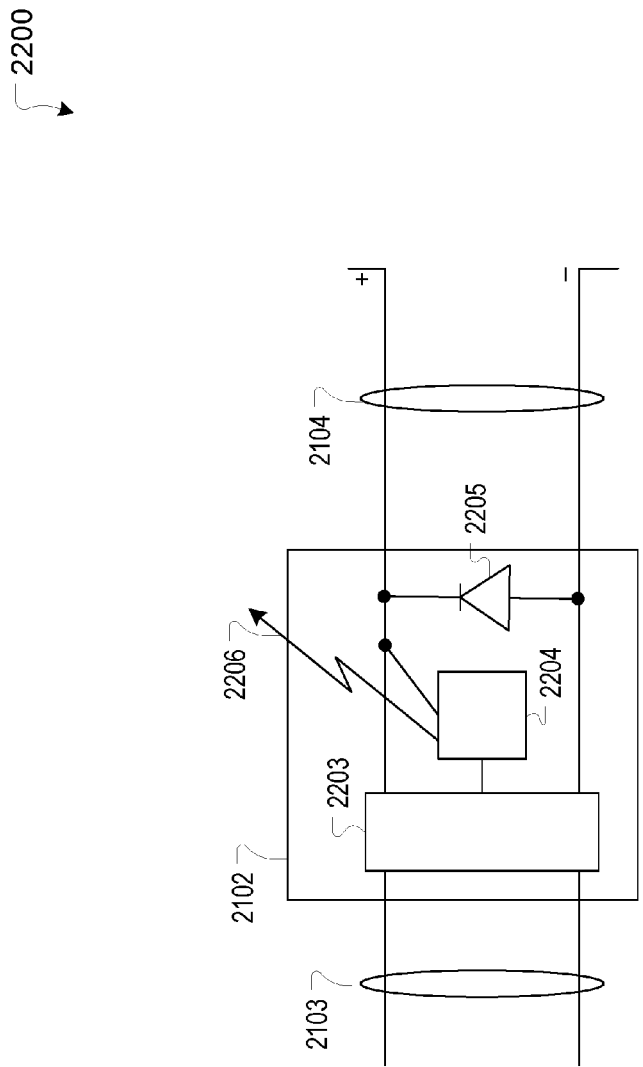
FIG. 19 illustrates a solar module and a detail view of an embodiment of a junction box.

FIG. 19 shows an overview of an exemplary photovoltaic power system 2200 that is known to the inventors. Wires from the panel 2103 feed into converter or adaptor 2203. A controller 2204 is also present, which controller communicates with a central controller 2109 (shown in FIG. 10) as indicated by arrow 2206, in some cases via a wire line and in other cases wirelessly. Often a diode 2205 may be included for reversal of the panel, or if the panel has weak cells, to avoid reversal of the panel. The configuration shown in FIG. 19 is typical of a string configuration, but similarly it may apply in ac or other similar configurations, or high-voltage bus configurations, all of which are known to the inventors. It is clear that in the case of an ac configuration, diode 2205 would not be included in the system, because it would create serious problems.

Figure 20:
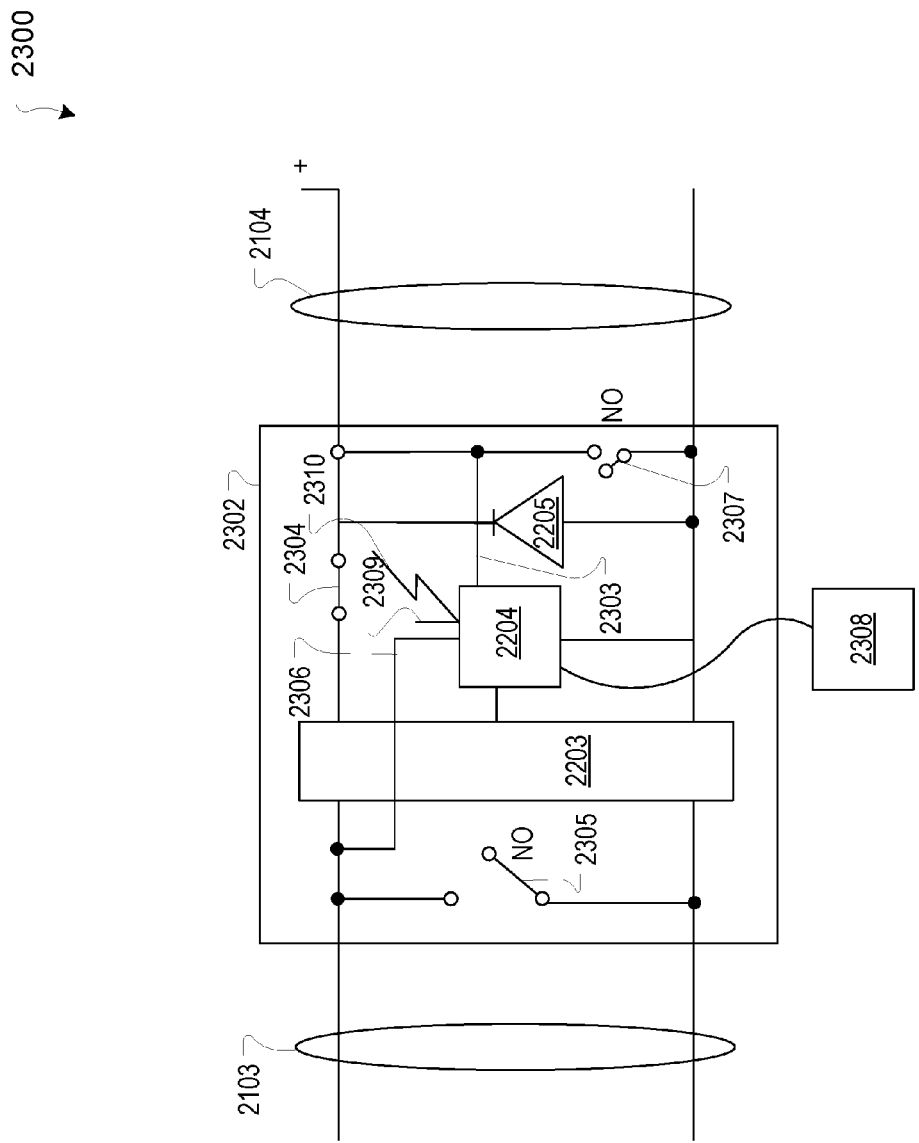
FIG. 20 illustrates an embodiment of a junction box.

FIG. 20 shows an overview of an exemplary system 2300 according to one embodiment of the current invention. System 2300 is essentially an enhancement of system 2200, wherein the controller 2204 now has additional code 2308, which code performs the shut-down function of the current invention. Also shown are several normally open or normally closed switches. Not all the switches are necessarily in all embodiments of the current invention. For example, switch 2305 is used to short a panel. In this example it is shown as a normally open switch, controlled by controller 2204 (control line not shown). However, rather than a mechanical switch, the on/off device could be typically a suitable semiconductor device, including but not limited to a FET or MOSFET, or it could be an IGBT type of transistor that can take the current and short the panel. Also, in some cases, rather than shorting the panel, the on/off device would create an active load to the panel and would allow a voltage to continue feed to the controller, as is shown by the feeding line, even though the inverter or converter 2203 may be shut off. Also shown is a switch 2304, which is normally closed. Again, rather than a mechanical switch, this could be a FET, MOSFET, or other similar suitable type of semiconductor switch. It is normally closed to allow the power of the inverter to flow out into the wiring; however, it could go into a normal open state and thus disconnect the panel. In some cases, the converter or inverter 2203 may achieve the same function internally by managing switching devices already inside a converter accordingly. Also, in some cases, switch 2307 may short the panel bypass. In particular, in the case of an ac system, where there is no diode, a bypass may be desirable. In other cases, no bypass is desired, or, in the case of a high-voltage system a bypass may even be not desirable. The shut-off may be triggered by, for example, the absence of a regular signal from the main controller (not shown). In other cases, for example, a fault in the wiring, which can be detected by controller 2204 by comparing different voltages, etc., may also automatically trigger a disconnect. In yet other cases, additionally, for example, the plus or the minus may be connected to ground to add security. In some cases, system 2300 may have a local capacitor or battery to power the unit even after loss of power from both sides.

Figure 21:
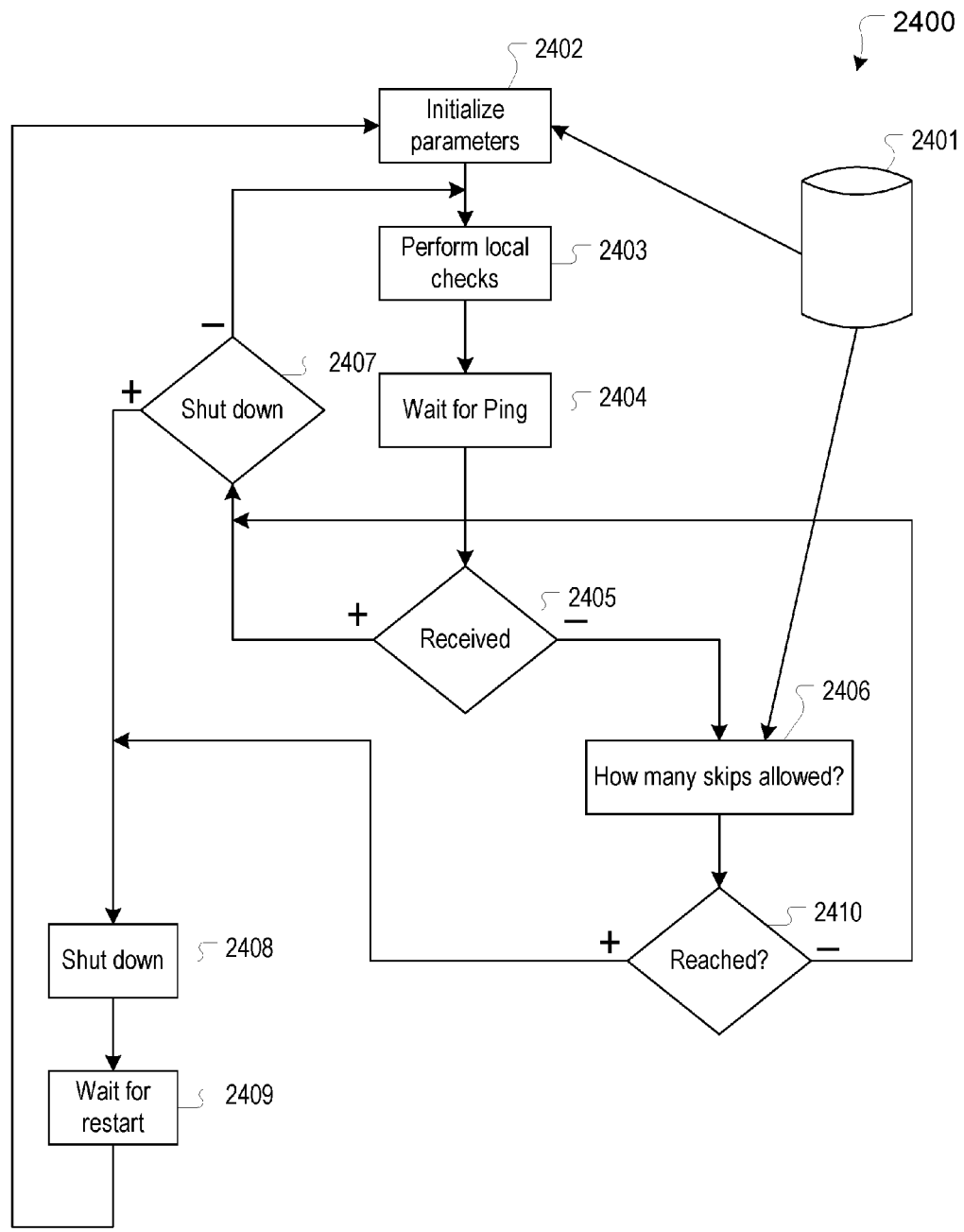
FIG. 21 illustrates an embodiment of a method of controlling the output of a solar module.

FIG. 21 shows an exemplary process 2400 for implementation of the watch dog code 2308 according to one embodiment of the present invention. In operation 2402 parameters are initialized based on data from a storage 2401 that would typically be an E2PROM in the device itself, and hence it could even survive loss of power. After initialization, in operation 2403 the software executes local checks, which checks may include checking that the wiring, voltages, and other components are correct and all signals present as they should be for normal operation. In operation 2404 the software waits for a ping from the main controller. In some cases, the software may not wait for an incoming ping, but rather, it may issue a challenge and receive a response to that challenge. Other, similar well known methods of two-way verification may by used. At operation 2405, the process branches. If the software receives a response it moves to operation 2407 to determine whether the response is a shut-down signal. If the response is not a shutdown signal (negative), the software loops back to operation 2403. If the response is a shut-down signal, the software moves to operation 2408, where it shuts down the system and, in operation 2409, waits for a restart signal, after which it returns to operation 2402. If, in operation 2405, the software does not receive a ping or other expected response within an allotted time, it moves to operation 2406, where it checks the number of allowed skips. Depending on the circumstances, a certain number of skips may be allowed, particularly if the "heartbeats" of the ping are set at a high rate, such as 100 or even 1000 per second. In such cases, the software may allow two, five, or even 100 skips (this limit is drawn from data store 2401) before it moves to operation 2410, where the process again branches. If the software receives a response before the limit is reached (−), the process loops back to operation 2407 and continues as described above. If the software receives no response by the time/count the skip limit is reached (+), the process moves to operation 2408 and proceeds as described above. If the device has a battery, as mentioned above, it may remain in shut-down mode until it either receives a restart signal or until the battery runs down, in which case it does a complete shut-down.

Figure 22:
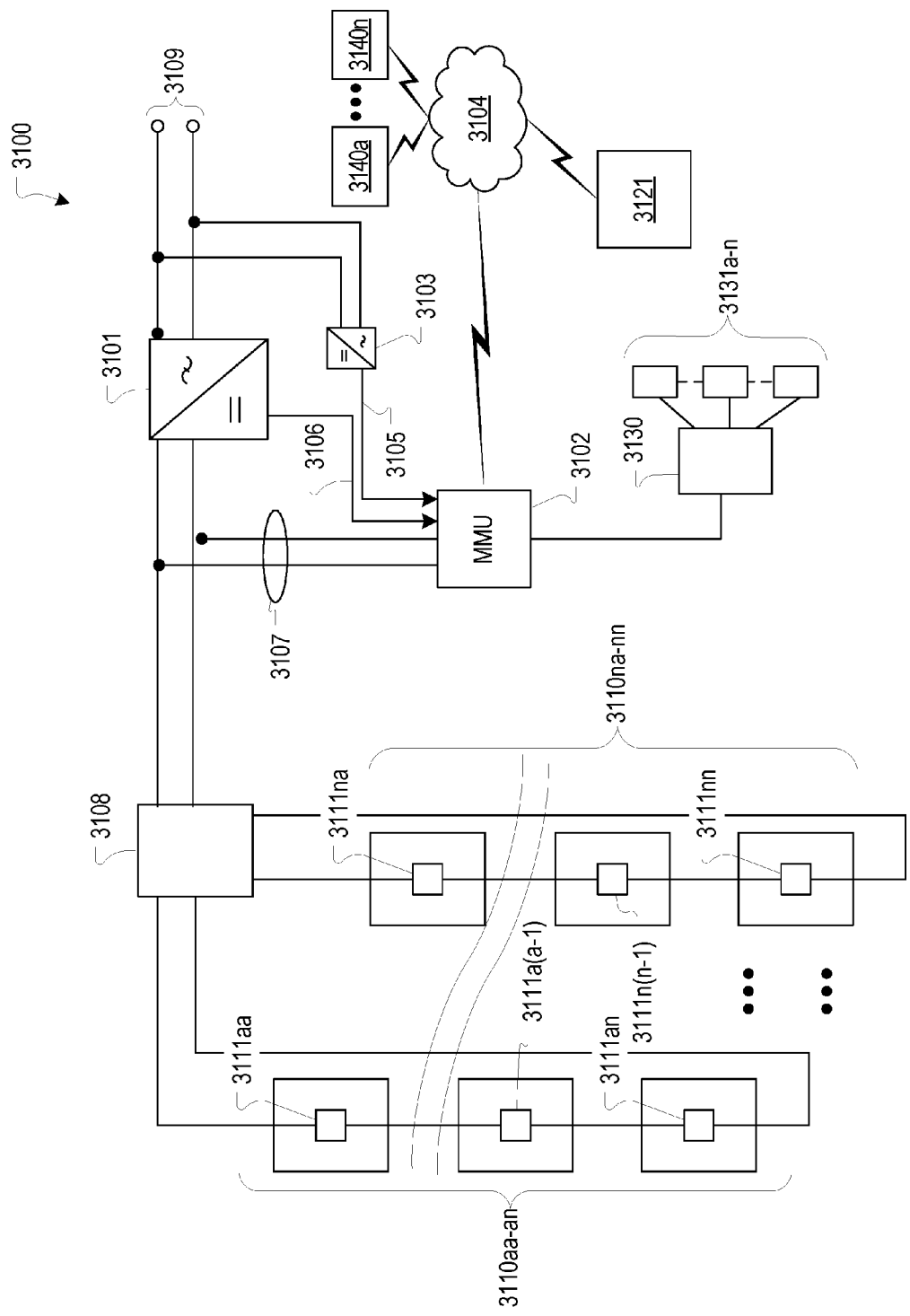
FIG. 22 illustrates an embodiment of an energy production system including a master management unit.

FIG. 22 shows an exemplary system 3100 according to one aspect of the system and method disclosed herein. Solar panels 3110$aa$-$nn$ are installed in multiple strings. The outputs of the strings are typically joined in combiner box 3108, which then connects to inverter 3101, which in turn connects to power grid 3109. As mentioned earlier, additional hardware (not shown) such as relays or semiconductor switching elements with an additional local controller may be provided, to allow each string to be powered up individually, thus reducing energy and power needed to poll panels or their respective local units. This example shows, for reasons of simplicity and clarity, only a single-phase power grid, but the power grid could be a much larger and more complex multi-phase power grid. Also shown is a master management unit (MMU) 3102 (which is an example of a local system controller) and an auxiliary power supply 3103, which connects directly to the power grid and which can, via feed route 3105, provide energy into MMU 3102. MMU 3102 connects via lines 3107 to the dc wiring system and can, therefore, feed back dc current to the solar panel array, via the combiner box(es) 3108 (only one shown) to the panels and their respective LMUs. In other cases an auxiliary power supply may connect directly to the dc wiring between combiner box 3108 and inverter 3101. Wiring 3106 allows the MMU 3102 to interact with the inverter 3108 and, for example, suppress false starts of the inverter on the auxiliary voltage. MMU 3102 or some other, similarly suitable controller, may, for example, turn on only the dc voltage every two or three minutes for a few seconds, thus sending just enough current to wake up the LMUs 3111$aa$ through 3111$nn$ in the panels and allow them to do a quick query, each of their respective panels. Then if, for example, two minutes later, one of the units does not respond to the query, the system would send an alarm indicating a possible security breach, such as a wire being cut or a panel being removed. In some cases, before sending an alarm, a re-test may be done, to verify that the alarm is caused by a non-responding panel, rather than just a temporary problem polling a unit. Also shown is information server 3121, which may belong to an operator of multiple sites with information directed to control specific sites. Additional servers 3140*a* through 3140*n* could be, for example, emergency servers of a public agency relevant to the location of the system, USGS earthquake monitors (relevant cases), etc. In some cases, information server 3121 may download information from these servers and then prepare it by location and send a signal to MMU 3102 via a network 3104. In other cases, the MMU 3102 may pull that information directly from those servers. Controller 3130 controls multiple sensors 3131*a-n*, which could be, for example, smoke sensors, fire sensors, flow sensors, or other practical emergency sensors.

Figure 23:
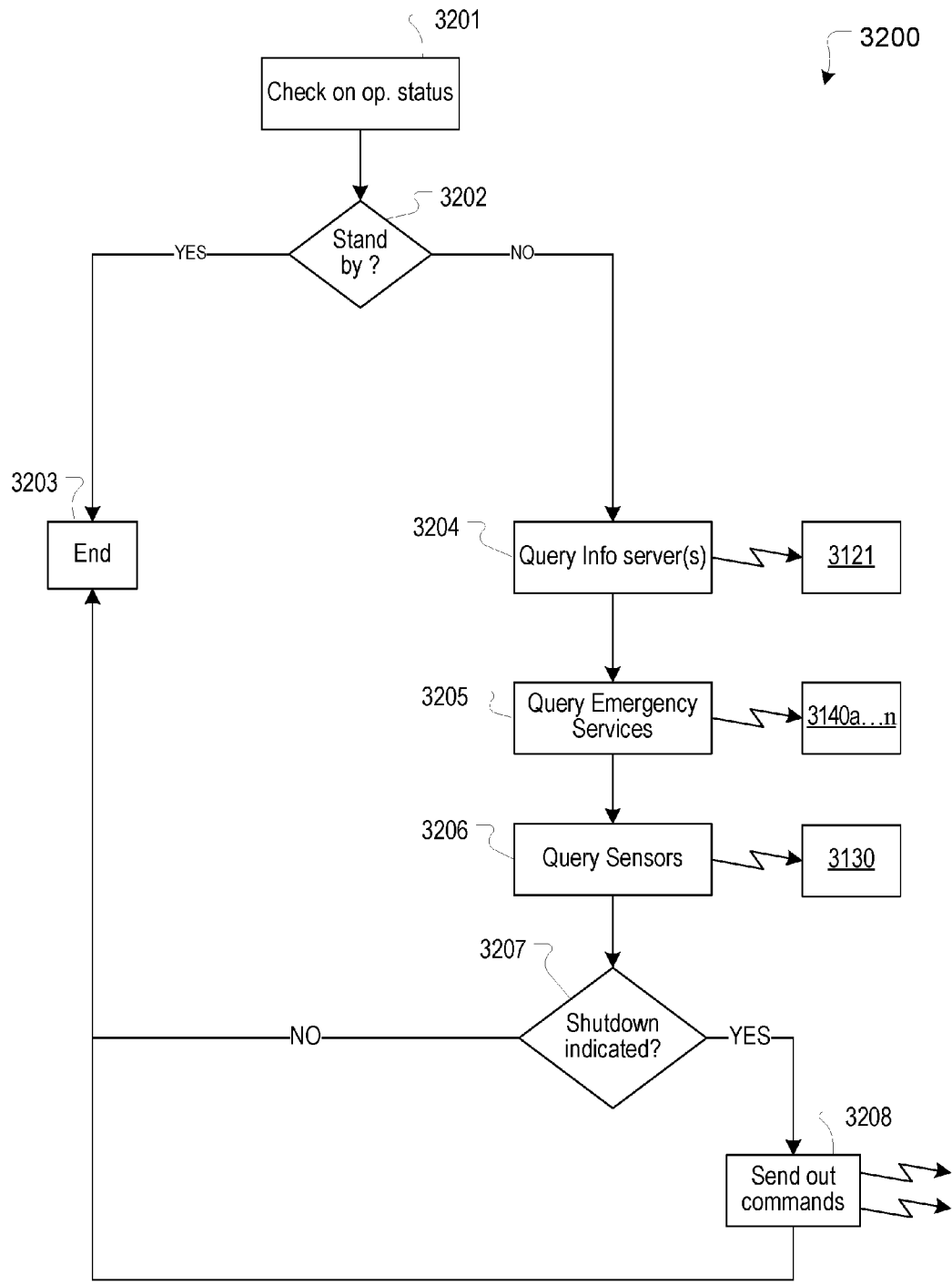
FIG. 23 shows an embodiment of an exemplary process residing a master management unit controlling the output of a solar module.

FIG. 23 shows an exemplary process 3200 implemented by a software instance residing in MMU 3102, according to one aspect of the system and method disclosed herein. In operation 3201 the program checks the operating status of the MMU 3102. In operation 3202, the process branches. If the unit is in standby operating mode (yes), the process moves to operation 3203, where it ends. If the unit is not in standby mode (no), the process moves to operation 3204, where the program queries information server 3121 for applicable local information regarding possible events that warrant a shutdown or other control changes. Similarly, in operation 3205 the program queries emergency servers 3140*a-n*, and in operation 3206 it queries controller 3130 for input from sensors 3131*a-n*. In some cases the sensors may be connected directly to the MMU 3102 through additional ports. In other cases there may be multiple controllers 3130, and in yet other cases, MMU 3102 may connect to an existing fire alarm system controller, and pulling the fire alarm could also shut off power generation, for example, either for all or for part of a system. In operation 3207 the program checks, based on some pre-existing values and rules, including, for example, location, ZIP code, and other information, whether any of the query results indicate a shut down anywhere in or in all the solar array. If no, the process moves to operation 3203, where the program ends. If yes, the process moves to operation 3208, where the program sends out commands to the indicated units, which commands could shut down or disconnect the inverter 3101. (In some cases, an additional galvanic disconnect, not shown here, is provided outside the inverter.) In some cases the program also instructs the LMUs to shut down, or in other cases the local power remains available but an additional disconnect shuts off the remote aspect. Also, in different cases, different actions may be taken. For example, if a local fire is indicated, some or all the panels in the affected area may be turned off as a safety measure for responding firefighters, but the remainder of the system may be left working. In case of an earthquake, as another example, a galvanic disconnect may shut off the connection to the power grid 40-109, but, for example only if a sensor (not shown) determines that the supply line has been broken (i.e., no safe connection).

It is clear that many modifications and variations of this embodiment may be made by one skilled in the art without departing from the spirit of the novel art of this disclosure. These modifications and variations do not depart from the broader spirit and scope of the invention, and the examples cited here are to be regarded in an illustrative rather than a restrictive sense.

What is claimed is:

1. An apparatus, comprising:
   a photovoltaic panel configured to generate electric power; and
   a local management unit coupled to the photovoltaic panel to receive the electric power as an input and generate a power output from the input;
   wherein the local management unit is configured to communicate with a master control unit disposed at a location remote to the local management unit;
   wherein a sensor is monitored for an anomaly; and
   wherein in response to a determination that the sensor has detected the anomaly, and in response to a determination that the anomaly requires a control change, the local management unit shuts down the power output based on a communication with the master control unit;
   wherein the local management unit is configured to receive heartbeat signals from the master control unit; and the local management unit shuts down the power output in response to a predetermined number of skips of the heartbeat signals.

2. The apparatus of claim 1, wherein the master control unit is configured to monitor the sensor via querying the sensor for the anomaly.

3. The apparatus of claim 1, wherein the master control unit is configured to monitor the sensor via receiving from the sensor notifications of the anomaly.

4. The apparatus of claim 1, wherein the communication includes a command selected from the group consisting of:
   a command to shut down; and
   a command to disconnect.

5. The apparatus of claim 1, wherein the master control unit is connected to a network; and the sensor is connected to the network.

6. The apparatus of claim 1, wherein the local management unit includes a voltage module coupled between the input and the power output.

7. A method, comprising:
   generating, by a photovoltaic panel, electric power; and
   receiving, in a local management unit coupled to the photovoltaic panel, the electricity power as an input;
   generating, by the local management unit from the input, a power output;
   communicating by the local management unit with a master control unit disposed at a location remote to the local management unit;
   sensing an anomaly; and
   in response to sensing the anomaly and a determination that the anomaly requires a control change, shutting down by the local management unit the power output based on a communication with the master control unit;
   wherein the communication with the master control unit includes heartbeat signals; and the anomaly includes skips of heartbeat signals.

8. The method of claim 7, wherein the master control unit queries a sensor for the anomaly over a network.

9. The method of claim 7, wherein the master control unit receives notification of the anomaly from a sensor over a network.

10. The method of claim 7, wherein the determination that the anomaly requires a control change is based on a count of the skips being about a threshold.

11. The method of claim 7, wherein the local management unit converts a voltage of the input to a voltage of the power output by operating a switch according to a duty cycle.

12. An apparatus, comprising:
a photovoltaic panel configured to generate electric power; and
a local management unit coupled to the photovoltaic panel to receive the electric power as an input and generate a power output from the input;
wherein the local management unit is configured to communicate with a master control unit disposed at a location remote to the local management unit;
wherein the local management unit is configured to detect an anomaly in heartbeat signals from the master control unit and the anomaly includes skips of heartbeat signals; and
wherein in response to a determination that the heartbeat signals have the anomaly, and in response to a determination that the anomaly requires a control change, the local management unit shuts down the power output.

13. The apparatus of claim 12, wherein the determination that the anomaly requires a control change is based on a count of the skips being above a threshold.

14. The apparatus of claim 12, wherein each heartbeat signal is to be receiving within an allotted time.

15. The apparatus of claim 12, wherein a sensor coupled with the master control unit is configured to detect an anomaly, based on which the master control unit is configured to instruct the local management unit to shut down the power output.

16. The apparatus of claim 15, wherein the master control unit is configured to receive an anomaly notification over a network from the sensor.

17. The apparatus of claim 15, wherein the master control unit is configured to receive a response to an anomaly query over a network from the sensor.

* * * * *